(12) United States Patent
Suzuki

(10) Patent No.: US 9,406,599 B2
(45) Date of Patent: Aug. 2, 2016

(54) WIRING SUBSTRATE AND METHOD FOR MANUFACTURING WIRING SUBSTRATE

(71) Applicant: SHINKO ELECTRIC INDUSTRIES CO., LTD., Nagano (JP)

(72) Inventor: Tomohiro Suzuki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/824,174

(22) Filed: Aug. 12, 2015

(65) Prior Publication Data
US 2016/0064319 A1 Mar. 3, 2016

(30) Foreign Application Priority Data

Aug. 29, 2014 (JP) ................. 2014-176097

(51) Int. Cl.
*H05K 1/09* (2006.01)
*H01L 23/498* (2006.01)
*H01L 23/492* (2006.01)
(Continued)

(52) U.S. Cl.
CPC ........ *H01L 23/49827* (2013.01); *H01L 21/486* (2013.01); *H01L 21/4857* (2013.01); *H01L 23/492* (2013.01); *H01L 23/49822* (2013.01); *H01L 23/49866* (2013.01); *H05K 3/10* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/181* (2013.01)

(58) Field of Classification Search
CPC ............ H05K 1/09; H05K 1/11; H05K 3/10; H05K 3/30; H05K 7/02; H01L 21/00; H01L 21/44; H01L 21/60; H01L 23/498; H01L 23/544
USPC ........... 174/251, 257, 261–263, 266; 29/832, 29/846, 850, 879, 885; 361/808; 257/737, 257/797
See application file for complete search history.

(56) References Cited

U.S. PATENT DOCUMENTS

| 7,303,978 B2 * | 12/2007 | Ito ..................... H01L 21/4853 257/E21.503 |
| 8,389,871 B2 * | 3/2013 | Maeda ................ H05K 3/4682 174/261 |
| 8,458,900 B2 * | 6/2013 | Kodani .............. H01L 21/4853 29/832 |

(Continued)

FOREIGN PATENT DOCUMENTS

| JP | 2010-135474 | 6/2010 |
| JP | 2010-251552 | 11/2010 |
| JP | 2011-199270 | 10/2011 |

*Primary Examiner* — Xiaoliang Chen
(74) *Attorney, Agent, or Firm* — IPUSA, PLLC

(57) ABSTRACT

A wiring substrate includes an insulating layer, a wiring layer, a via wiring, and a solder resist layer. The wiring layer includes a pad body that constitutes a part of a pad and a wiring pattern including an upper surface. The pad includes the pad body, a first metal layer formed on an upper surface of the pad body and including an embedded part embedded in the insulating layer and a projecting part including upper and side surfaces and projecting from the upper surface of the insulating layer, and a second metal layer including an upper surface and covering the upper and side surfaces of the projecting part. The upper surface of the pad body and the upper surface of the wiring pattern are on the same plane. The upper surface of the second metal layer is positioned lower than the upper surface of the solder resist layer.

7 Claims, 11 Drawing Sheets

(51) Int. Cl.
*H01L 21/48* (2006.01)
*H05K 3/10* (2006.01)

(56) References Cited

U.S. PATENT DOCUMENTS

| | | | | |
|---|---|---|---|---|
| 8,525,356 B2 * | 9/2013 | Nakamura | .......... | H01L 21/4857 257/797 |
| 2008/0298038 A1 * | 12/2008 | Kaneko | ............ | H01L 23/49811 361/808 |
| 2010/0132997 A1 * | 6/2010 | Hando | ............. | H01L 23/49816 174/262 |
| 2010/0140800 A1 * | 6/2010 | Hagihara | ............... | H01L 21/563 257/737 |
| 2010/0155116 A1 * | 6/2010 | Kawai | .................... | H05K 1/113 174/257 |
| 2010/0163293 A1 * | 7/2010 | Kawai | .................... | H05K 1/113 174/261 |
| 2012/0222894 A1 * | 9/2012 | Kaneko | ................. | H05K 3/244 174/257 |

\* cited by examiner

WIRING SUBSTRATE AND METHOD FOR MANUFACTURING WIRING SUBSTRATE

CROSS-REFERENCE TO RELATED APPLICATIONS

This application is based upon and claims the benefit of priority of the prior Japanese Patent Application No. 2014-176097 filed on Aug. 29, 2014, the entire contents of which are incorporated herein by reference.

FIELD

The embodiments discussed herein are related to a wiring substrate and a method for manufacturing a wiring substrate.

BACKGROUND

Conventionally, a known wiring substrate includes alternately layered wiring layers and insulating layers in which the wiring layers are connected to each other by way of a via hole penetrating the insulating layers. In this wiring substrate, a pad that is to be connected to a semiconductor chip or the like may be formed to project from a surface of an insulating layer. The pad may include a copper layer that is formed to project from the surface of an insulating layer and a surface plating layer that is formed to have a nickel layer and a gold layer sequentially layered on the upper and side surfaces of the copper layer. The amount in which the pad projects from the surface of the insulating layer including the surface plating layer may be approximately 15 µm to 50 µm (see, for example, Japanese Laid-Open Patent Publication No. 2010-251552).

However, in a case where the pad projects from the surface of the insulating layer, the surface plating layer may be damaged during a process of manufacturing a wiring substrate. In order to prevent such problem, a solder resist layer may be provided in the periphery of the pad. However, the solder resist layer requires to be substantially thick (e.g., approximately 20 µm to 60 µm) so that the upper surface of the solder resist layer is higher than the upper surface of the surface plating layer. This makes thickness reduction of the wiring substrate difficult.

Although thickness reduction of the wiring substrate can be achieved to some degree by reducing the thickness of the nickel layer, connection reliability (wettability) of the pad during wiring bonding or flip-chip bonding may be degraded. Further, by reducing the thickness of the nickel layer, the barrier effect of the nickel layer may become insufficient due to the thickness of the nickel layer being significantly reduced at the side surface of the copper layer. This may cause copper to spread to the solder formed on the pad.

SUMMARY

According to an aspect of the invention, there is provided a wiring substrate including an insulating layer including upper and lower surfaces, a wiring layer including upper, lower, and side surfaces and being in a position that is recessed relative to the upper surface of the insulating layer, a via wiring formed in the insulating layer and connected to the lower surface of the wiring layer, and a solder resist layer formed on the upper surface of the insulating layer. The via wiring includes a first part contacting the lower surface of the wiring layer and a second part exposed from the lower surface of the insulating layer, the first part having an area smaller than an area of the second part. The wiring layer includes a pad body that constitutes a part of a pad and a wiring pattern including an upper surface. The solder resist layer includes an upper surface and an opening that exposes the pad and a part of the upper surface of the insulating layer. The solder resist layer buries a step part formed by the upper surface of the insulating layer and the upper surface of the wiring pattern. The pad includes the pad body including an upper surface, a first metal layer formed on the upper surface of the pad body and including an embedded part embedded in the insulating layer and a projecting part including upper and side surfaces and projecting from the upper surface of the insulating layer, and a second metal layer including an upper surface and covering the upper and side surfaces of the projecting part of the first metal layer. The upper surface of the pad body and the upper surface of the wiring pattern are on the same plane. The upper surface of the second metal layer is positioned lower than the upper surface of the solder resist layer.

The object and advantages of the invention will be realized and attained by means of the elements and combinations particularly pointed out in the claims.

It is to be understood that both the foregoing general description and the followed detailed description are exemplary and explanatory and are not restrictive of the invention, as claimed.

DESCRIPTION OF EMBODIMENTS

Figure 1A:
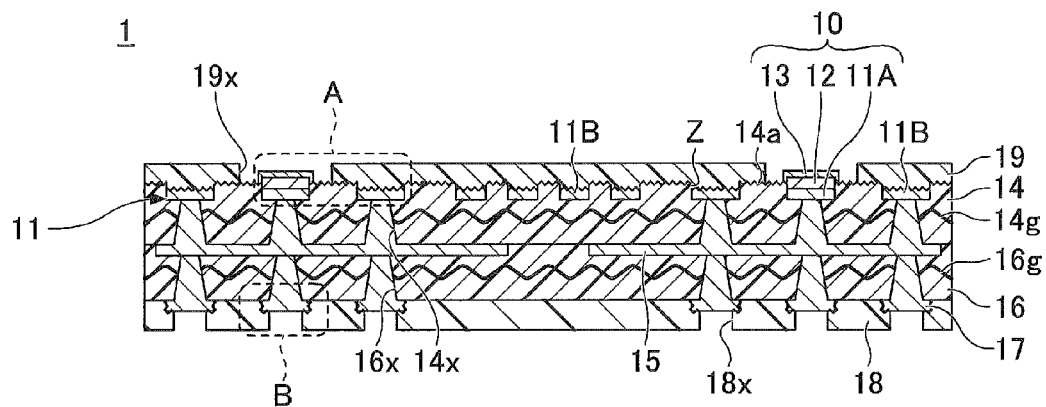
FIGS. 1A-1D are cross-sectional views illustrating a wiring substrate according to a first embodiment of the present invention.
Figure 1B:
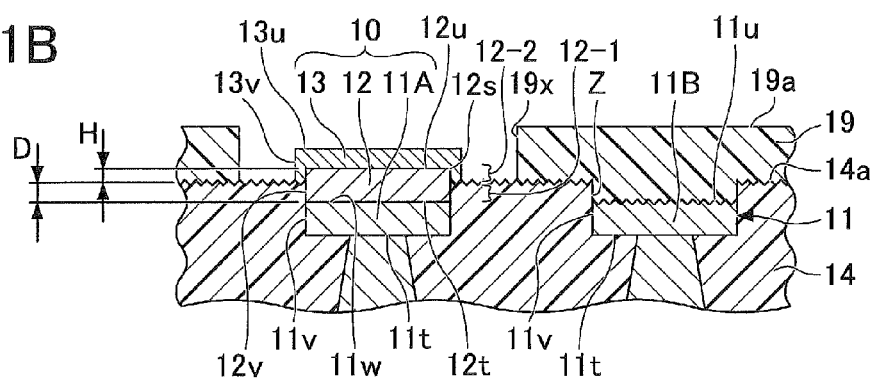
Figure 1C:
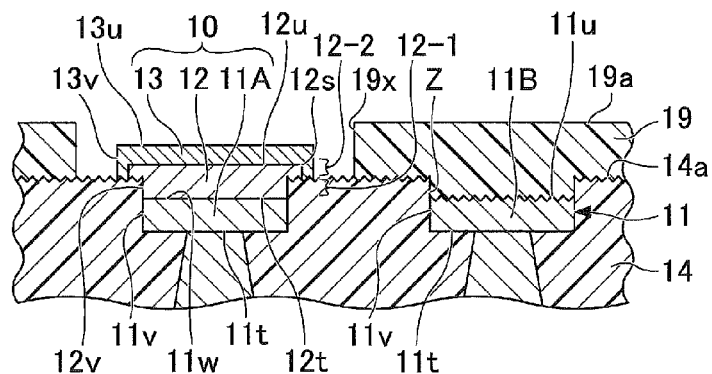
Figure 1D:
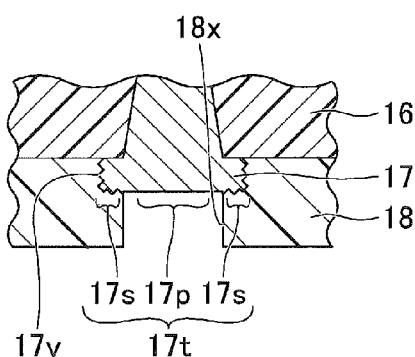

In the following, embodiments of the present invention are described with reference to the accompanying drawings.
<First Embodiment>
[Structure of Wiring Substrate of First Embodiment]
First, a structure of a wiring substrate 1 according to a first embodiment of the present invention is described. FIGS. 1A-1D are cross-sectional views illustrating the wiring substrate 1 of the first embodiment. FIGS. 1B and 1C are enlarged views of part A of FIG. 1A. FIG. 1D is an enlarged view of part B of FIG. 1A. FIGS. 2A-2E are plan views illustrating the vicinity part A of FIG. 1A. For the sake of convenience, a solder resist layer is illustrated with a satin finish pattern.

With reference to FIGS. 1A to 2C, the wiring substrate 1 includes a pad 10, a wiring layer 11, an insulating layer 14, a wiring layer 15, an insulating layer 16, a wiring layer 17, a solder resist layer 18, and a solder resist layer 19. The wiring layer 1 is a so-called coreless built-up wiring substrate.

For the sake of convenience, the side positioned toward the solder resist layer 19 (upper side in FIG. 1A) may be described as "upper side" or "one side" whereas the side positioned toward the solder resist layer 18 (lower side in FIG. 1A) may be described as "lower side" or "other side". Further, a surface of each part (element) positioned toward the side of the solder resist layer 19 may be described as "upper surface" or "one surface" whereas a surface of each part (element) positioned toward the solder resist layer 18 may be described as "lower surface" or "other surface". Further, a "plan view" refers to observing an object from a direction of a line normal to an upper surface 14a of the insulating layer 14. A "plan-view shape" refers to a shape observed from a direction of a line normal to the upper surface 14a of the insulating layer 14.

In the wiring substrate 1, the insulating layer 14 is a layer on which the wiring layer 11 is to be formed. A non-photosensitive thermosetting insulating resin having, for example, an epoxy type resin as a main component may be used as the material of the insulating layer 14. In this embodiment, the insulating layer 14 includes a reinforcement member 14g. The reinforcement member 14g may be, for example, a woven or non-woven fabric such as glass fabric or an aramid fabric. The insulating layer 14 may include a filler such as silica ($SiO_2$). The thickness of the insulating layer 14 may be, for example, approximately 10 μm to 50 μm.

The upper surface 14a of the insulating layer 14 is a roughened surface. The average roughness (Ra) of the upper surface 14a of the insulating layer 14 may be greater than or equal to 0.3 μm and less than 0.8 μm. The roughness of the upper surface 14a of the insulating layer 14 may be measured by using an optical interference device (also for measuring the roughness of other surfaces). By roughening the upper surface 14a of the insulating layer 14, the adhesiveness between the upper surface 14a of the insulating layer 14 and the solder resist layer 19 can be improved.

The wiring layer 11 is embedded in the insulating layer 14. A lower surface 11t of the wiring layer 11 and a side surface 11v of the wiring layer 11 are covered by the insulating layer 14. The upper surfaces 11u, 11w of the wiring layer 14 are exposed in parts of the wiring layer 14 that are recessed from the upper surface 14a of the wiring layer 14. That is, step parts Z are provided between the upper surfaces 11u, 11w of the wiring layer 11 and the upper surface 14a of the insulating layer 14. For example, copper (Cu) may be used as the material of the wiring layer 11. The thickness of the wiring layer 11 may be, for example, approximately 5 μm to 20 μm. The depth of the parts of the wiring layer 14 from the upper surface 14a of the insulating layer 14 and the upper surface 11u, 11w of the wiring layer 11 (i.e., depth of step part Z) may be, for example, approximately 2 μm to 4 μm.

The wiring layer 11 includes a pad body 11A forming a part of a pad 10 and a wiring pattern 11B. The width of the wiring pattern 11B need not be constant. For example, a part of the wiring pattern 11B that is to be connected to a via wiring may be formed to have a large width (end part of the wiring pattern 11B). Further, the end part of the wiring pattern 11B may be connected to the pad 10. The upper surface 11w of the pad body 11A and the upper surface 11u of the wiring pattern 11B are positioned substantially on the same plane. In a case where the pad body 11A and the wiring pattern 11B need not be distinguished from each other, the pad body 11A and the wiring pattern 11B may be simply referred to as "wiring layer 11". The wiring pattern 11B may be provided in a narrow pitch for connecting multiple electronic devices (e.g., semiconductor devices) mounted on the wiring substrate 1. Alternatively, the wiring pattern 11B may be provided as a lead out wiring.

The pad 10 includes a pad body 11A. The pad 10 also includes first and second metal layers 12, 13 that are sequentially layered on the upper surface 11w of the pad body 11A. The pad 10 is a part that is to be connected to a semiconductor chip or the like by way of a bonding wire or solder. For example, multiple pads 10 may be arranged along the periphery of the semiconductor chip or the like. In this case, the pads 10 may be provided in multiple rows.

Figure 2A:
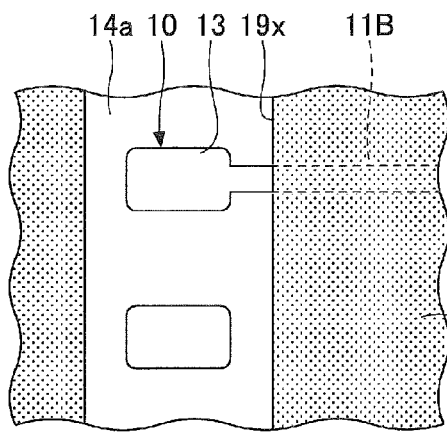
FIGS. 2A-2E are plan views illustrating the vicinity of part A of FIG. 1A.
Figure 2D:
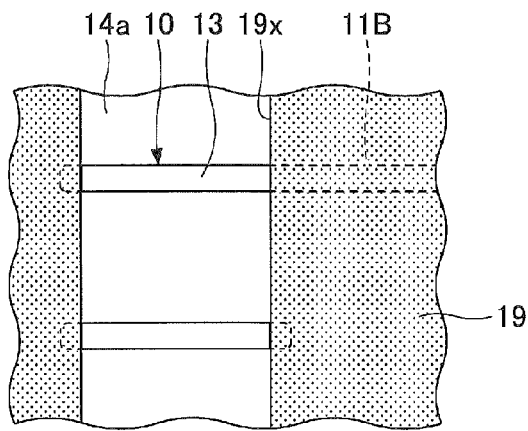
Figure 2B:
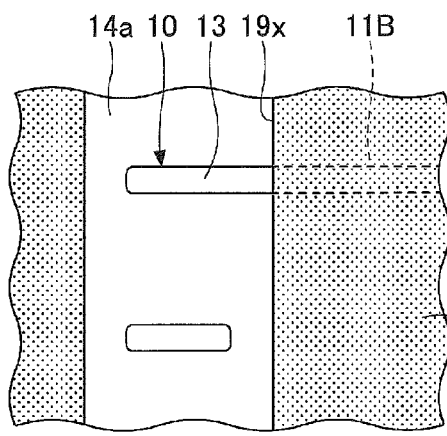

As illustrated in FIG. 2A, the plan-view shape of the pad 10 may be, for example, a rectangular shape. In this case, the width of the pad 10 may be substantially the same as the width of the wiring pattern 11B as illustrated in FIG. 2B. Alternatively, the plan-view shape of the pad 10 may be another shape such as a circular shape. In this case, the diameter of the pad 10 may be, for example, approximately 50 μm to 100 μm.

Figure 2E:
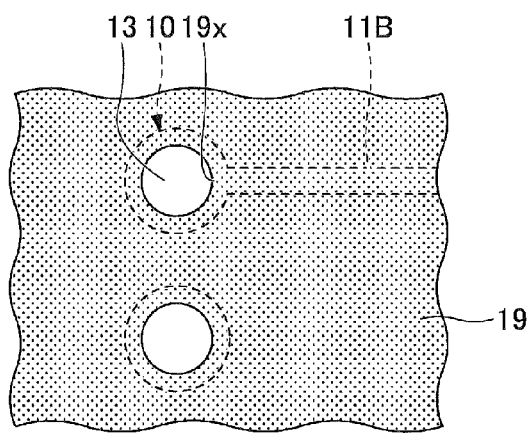
Figure 2C:
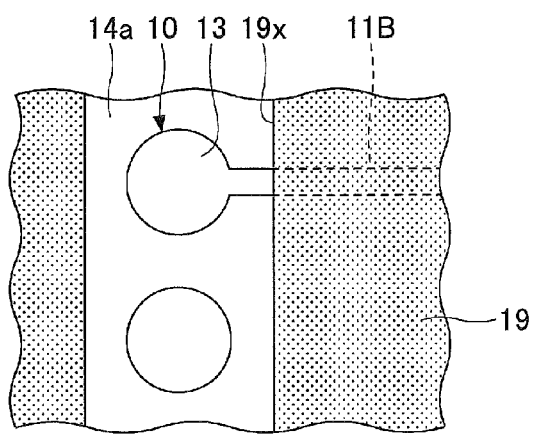

As illustrated in FIGS. 2A-2C, a so-called NSMD (Non-Solder Mask Define) structure may be formed in which an opening 19x is formed larger than the pad 10, so that the pad 10 is entirely exposed in the opening 19x. Alternatively, the pad 10 may be partly covered by the solder resist layer 19 as illustrated in FIGS. 2D and 2E. FIG. 2E illustrates a so-called SMD (Solder Mask Define) structure.

It is to be noted that an upper surface 11w of the pad body 11A is a smooth surface having an average roughness (Ra) of, for example, approximately 0.05μm or more and less than 0.2 μm. By smoothening the upper surface 11w of the pad body 11A, both an upper surface 12u of the first metal layer 12 and an upper surface 13u of the second metal layer 13 formed on the upper surface 12u of the first metal layer 12 can also become smooth surfaces. If the upper surface 11w of the pad body 11A is a roughened surface, the roughened surface may cause the thicknesses of the first and second metal layers 12, 13 to become uneven. However, by forming the upper surface 11w of the pad body 11A into a smooth surface, the thicknesses of the first and second metal layers 12, 13 can be even. Thereby, for example, wettability can be improved when connecting a bonding wire to the upper surface 13u of the second metal layer 13 or connecting an electrode pad of a semiconductor chip by way of solder. Thus, connection reliability can be improved.

On the other hand, an upper surface 11u of the wiring pattern 11B is a roughened surface that has an average roughness (Ra) of, for example, approximately 0.3 μm or more and less than 0.8 μm. The wiring pattern 11B that is to be covered by the solder resist layer 19 can attain an anchor effect by roughening the upper surface 11u of the wiring pattern 11B. Thereby, the adhesiveness between the wiring pattern 11B and the solder resist layer 19 can be improved.

The first metal layer 12 of the pad 10 is formed on the upper surface 11w of the pad body 11A. The first metal layer 12 includes an embedded part 12-1 embedded in the insulation layer 14 and a projecting part 12-2 projecting from the upper surface 14a of the insulating layer 14. That is, the first metal layer 12 has a part of the side surface 12v embedded in the insulating layer 14 and another remaining part of the side surface 12v exposed from the insulating layer 14. More specifically, the embedded part 12-1 is formed by having a lower surface 12t of the first metal layer 12 contact the upper surface 11w of the pad body 11A and having a lower end side (i.e., side toward the pad body 11A) of the side surface 12v of the first metal layer 12 contact and be covered by the insulating layer 14. Further, the projecting part 12-2 is formed by having an upper end side (i.e., side toward the second metal layer 13) of the side surface 12v of the first metal layer 12 and the upper surface 12u of the first metal layer 12 exposed from the insulating layer 14. For example, nickel (Ni) may be used as the material of the first metal layer 12. The thickness of the first metal layer 12 may be, for example, approximately 3 μm to 10 μm. The height H of the upper surface 12u of the first metal layer 12 from the upper surface 14a of the insulating layer 14 (i.e., projecting amount of the projecting part 12-2 of the first metal layer 12) may be, for example, approximately 1 μm to 8 μm. The embedded part 12-1 and the projecting part 12-2 are formed of the same material and are integrally (continuously) formed.

As illustrated in FIG. 1C, an outer peripheral part 12s of the projecting part 12-2 of the first metal layer 12 may contact the upper surface 14a of the insulating layer 14 and extend in a surface direction. That is, the diameter of the projecting part 12-2 of the first metal layer 12 is greater than the diameter of the embedded part 12-1 of the first metal layer 12 (diameter of an opening of the insulating layer 14 that exposes the pad body 11A). For example, in a case where the plan-view shape of the pad 10 is a circular shape, the outer peripheral part 12s of the projecting part 12-2 of the first metal layer 12 extends to the upper surface 14a of the insulating layer 14 to form a circular ring-like shape. The first metal layer 12 may be formed by using, for example, a plating process. The shapes illustrated in FIG. 1B or FIG. 1C can be obtained based on the conditions of the plating process. In the example illustrated in FIG. 1B or FIG. 1C, the cross section of the part that connects the upper surface 12u of the first metal layer 12 and the side surface 12v of the first metal layer 12 may have, for example, a rounded shape (R-shape) or a chamfered shape.

The second metal layer 13 of the pad 10 is formed to cover the projecting part 12-2 of the first metal layer 12 (exposed part of the first metal layer 12 projecting from the upper surface 14a of the insulating layer 14) and the side surface 12v of the first metal layer 12. For example, gold (Au) may be used as the material of the second metal layer 13. The thickness of the second metal layer 13 may be, for example, approximately 0.06 μm to 1 μm. The upper surface 13u of the second metal layer 13 is positioned lower than the upper surface 19a of the solder resist layer 19. The height (vertical) difference between the upper surface 13u of the second metal layer 13 and the upper surface 19a of the solder resist layer 19 may be, for example, approximately 3 μm to 10 μm.

The solder resist layer 19 is formed on the upper surface 14a of the insulating layer 14. More specifically, the solder resist layer 19 includes an opening 19x that exposes the pad 10. The solder resist layer 19 is formed to bury a step part Z formed by the upper surface 14a of the insulating layer 14 and the upper surface 11u of the wiring pattern 11B. It is to be noted that one opening 19x may be provided in correspondence with each pad 10. Alternatively, one opening 19x may be provided to expose multiple pads 10. Further, a part of the wiring pattern 11B connected to the pad 10 may be exposed in the opening 19x. In this case, the first and second metal layers 12, 13 are also layered on the wiring pattern 11B exposed in the opening 19x. For example, a photosensitive insulating layer having a phenol type resin or a polyimide type resin as a main component may be used as the material of the solder resist layer 19. Alternatively, a non-photosensitive insulating resin (thermosetting resin) having, for example, an epoxy type resin or a polyimide type resin as a main component may be used as the material of the solder resist layer 19. The solder resist layer 19 may include a filler such as silica ($SiO_2$) or alumina. The thickness of the solder resist layer 19 may be, for example, approximately 5 μm to 12 μm.

The wiring layer 15 is formed on the side of the lower surface of the insulating layer 14. The wiring layer 15 includes a via wiring filled in a via hole 14x that penetrates the insulating layer 14 and exposes a lower surface of the wiring layer 11. The wiring layer 15 also includes a wiring pattern formed on the lower surface of the insulating layer 14. The via hole 14x may be a recess including one opening on a side of the insulating layer 16 and another opening exposing a lower surface of the wiring layer 11 in which the one opening has an area that is larger than the area of the bottom surface of the other opening. For example, in a case where the openings on both sides of the via hole 14x are circular shapes, the via hole 14x is a recess having a circular truncated cone shape.

That is, a part of the via wiring of the wiring layer 15 that contacts the lower surface of the wiring layer 11 has an area smaller than an area of a part of the via wiring of the wiring layer 15 that is exposed from the lower surface of the insulating layer 14 (a border part of the via wiring of the wiring layer 15 between the wiring pattern of the wiring layer 15). It is to be noted that the via wiring of the wiring layer 15 need not be connected to the entire lower surface of the pad body 11A and the entire lower surface of the wiring pattern 11B.

The wiring layer 15 is electrically connected to the wiring layer 11 exposed at a bottom part of the via hole 14x. For example, copper (Cu) may be used as the material of the wiring layer 15. The thickness of the wiring pattern of the wiring layer 15 may be, for example, approximately 5 μm to 20 μm.

The insulating layer 16 is formed on the lower surface of the insulating layer 14 to cover the wiring layer 15. The material of the insulating layer 16 may be the same insulating resin that is used to form the insulating layer 14. In this embodiment, the insulating layer 16 includes a reinforcement member 16g. The reinforcement member 16g may be, for example, a woven or non-woven fabric such as glass fabric or an aramid fabric. The insulating layer 16 may include a filler such as silica ($SiO_2$). The thickness of the insulating layer 16 may be, for example, approximately 10 μm to 50 μm.

The wiring layer 17 is formed on the side of the lower surface of the insulating layer 16. The wiring layer 17 includes a via wiring filled in a via hole 16x that penetrates the insulating layer 16 and exposes a lower surface of the wiring layer 15. The wiring layer 17 also includes a wiring pattern formed on the lower surface of the insulating layer 16. The via hole 16x may be a recess including one opening on a side of the solder resist layer 18 and another opening exposing a lower surface of the wiring layer 15 in which the one opening has an area that is larger than the area of the bottom surface of the other opening. For example, in a case where the openings on both sides of the via hole 16x are circular shapes, the via hole 16x is a recess having a circular truncated cone shape.

That is, a part of the via wiring of the wiring layer 17 that contacts the lower surface of the wiring layer 15 has an area smaller than an area of a part of the via wiring of the wiring layer 17 that is exposed from the lower surface of the insulating layer 16 (a border part of the via wiring of the wiring layer 17 between the wiring pattern of the wiring layer 17).

The wiring layer 17 is electrically connected to the wiring layer 15 exposed at a bottom part of the via hole 16x. For example, copper (Cu) may be used as the material of the wiring layer 17. The thickness of the wiring pattern of the wiring layer 17 may be, for example, approximately 5 μm to 20 μm.

The solder resist layer 18 is formed on the lower surface of the insulating layer 16 to cover the wiring layer 17. The solder resist layer 18 includes an opening 18x to selectively expose the wiring layer 17. A part of the wiring layer 17 is exposed at a bottom part of the opening 18x. More specifically, a lower surface 17t of the wiring layer 17 includes a center part 17p and an outer edge part 17s provided at an outer side of the center part 17p. The center part 17p of the lower surface 17t of the wiring layer 17 has a smooth surface whereas the outer edge part 17s of the lower surface 17t of the wiring layer 17 has a roughened surface. The outer edge part 17s of the lower surface 17t of the wiring layer 17 is covered by the solder resist layer 18. The center part 17p of the lower surface 17t of the wiring layer 17 is exposed in the opening 18x.

The roughness of the outer edge part 17s of the lower surface 17t of the wiring layer 17 and the roughness of a side surface 17v of the wiring layer 17 may be the same as the roughness of the upper surface 11u of the wiring pattern 11B. For example, the average roughness (Ra) of each of the outer edge part 17s of the lower surface 17t of the wiring layer 17 and the side surface 17v of the wiring layer 17 may be 0.3 μm or more and less than 0.8 μm. Further, the roughness of the center part 17p of the lower surface 17t of the wiring layer 17 may be the same as the roughness of the upper surface 11w of the pad body 11A. For example, the average roughness (Ra) of the center part 17p of the lower surface 17t of the wiring layer 17 may be 0.05 μm or more and less than 0.2 p.m. That is, the center part 17p of the lower surface 17t of the wiring layer 17 is a smooth surface.

The center part 17p of the lower surface 17t of the wiring layer 17 that is exposed at the bottom part of the opening 18x functions as a pad to be electrically connected to, for example, another wiring substrate or a semiconductor package. The thickness and the material of the solder resist layer 18 may be the same as those of the solder resist layer 19.

According to necessity, a surface processed layer (not illustrated) may be formed on the center part 17p of the lower surface 17t of the wiring layer 17 exposed at the bottom part of the opening 18x. The thickness of the surface processed layer may be, for example, approximately 0.5 μm to 1 μm. The surface processed layer may be, for example, a gold layer (Au), a nickel/gold (Ni/Au) layer (i.e. metal layer including a Ni layer and an Au layer layered in this order), or a nickel/palladium/gold (Ni/Pd/Au) layer (i.e. metal layer including an Ni layer, a Pd layer, and an Au layer layered in this order). Alternatively, a surface processed layer may be formed by performing an oxidation preventing process such as an OSP (Organic Solderability Preservative) process on the center part 17p of the lower surface 17t of the wiring layer 17 that is exposed at the bottom part of the opening 18x. The surface processes layer that is formed by the OSP process is an organic film formed of, for example, an azole compound or an imidazole compound.

In this embodiment, because the center part 17p of the lower surface 17t of the wiring layer 17 that is exposed at the bottom part of the opening 18x is a smooth surface, the lower surface of the surface processed layer that is formed on the center part 17p of the lower surface 17t of the wiring layer 17 also becomes a smooth surface, and the thickness of the surface processed layer becomes even. Thereby, connection reliability between the surface processed layer and an object (e.g., solder) connected to the surface processed layer can be improved.

<Method for Manufacturing Wiring Substrate of First Embodiment>

Next, a method for manufacturing a wiring substrate according to the first embodiment of the present invention is described. FIG. 3A-7D are schematic diagrams illustrating processes for manufacturing the wiring substrate of the first embodiment.

Figure 3A:
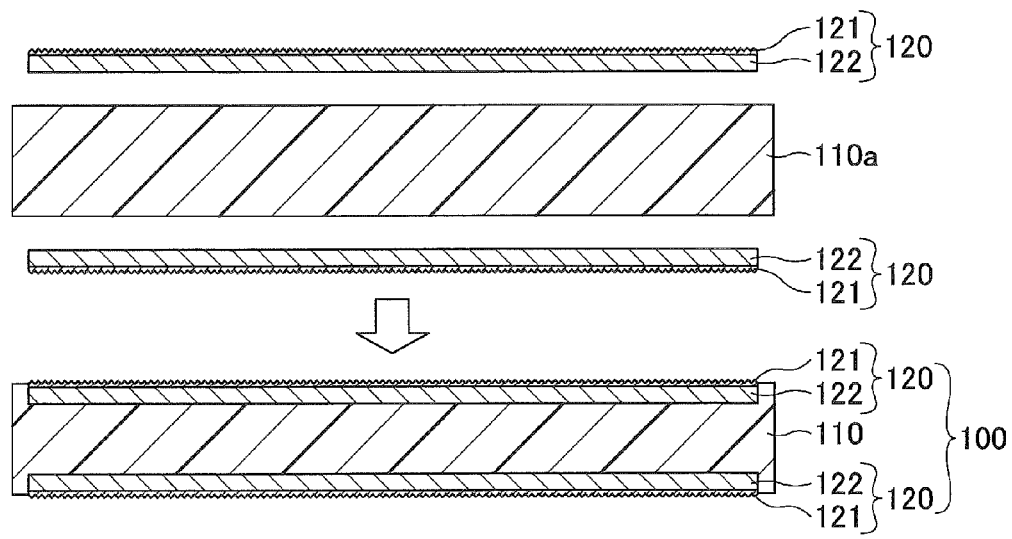
FIGS. 3A-7D are schematic diagrams illustrating processes for manufacturing a wiring substrate according to the first embodiment of the present invention.
Figure 3B:
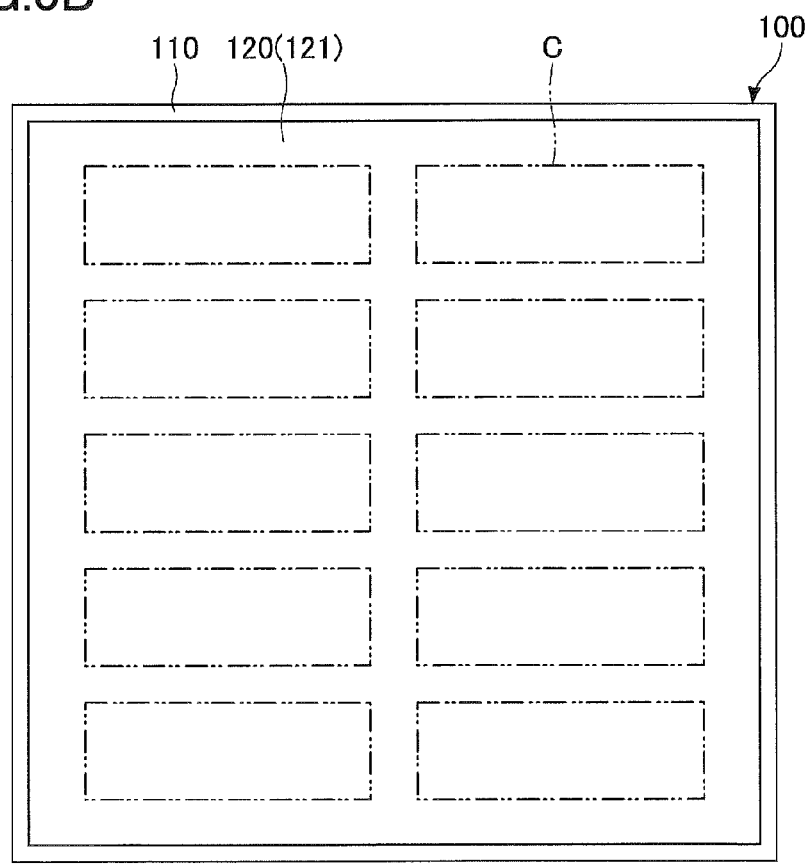

First, in the processes illustrated in FIGS. 3A and 3B, a support body 100 is fabricated. (FIG. 3A is a cross-sectional view illustrating the support body 100, FIG. 3B is a plan view illustrating the support body). More specifically, a prepreg 110a is first prepared. The prepreg 110a may be formed of a resin (e.g., epoxy type resin) impregnated in a woven or non-woven cloth (not illustrated) made of glass fiber or an aramid fiber. The prepreg 110a is in a B-stage (semi-cured) state. The plan-view shape of the prepreg 110a may be a rectangular shape having a dimension of approximately 400 mm to 500 mm in both length and width. The thickness of the prepreg 110a may be, for example, approximately 10 μm to 100 μm. However, depending on the strength that is desired for the support body 100, two superposed layers of the prepreg 110a may be used to form the support body 100. Instead of using the prepreg 110a, a resin that does not include a glass cloth or the like may be used to form the support body.

Then, two carrier-attached metal foils 120 are prepared. The carrier-attached metal foil 120 has a structure in which a thin foil 121 is peelably adhered on a thick foil (carrier foil) 122 by way of a peeling layer (not illustrated). The thick foil 122 may be formed of copper and have a thickness of, for example, approximately 10 μm to 50 μm. The thin foil 121 may also be formed of copper and have a thickness of, for example, 1.5 μm to 5 μm. The thick foil 122 is used as a supporting member for facilitating the handling of the thin foil 121. The carrier-attached metal foil 120 may be formed to have a slightly smaller plan-view shape than the plan-view shape of the prepreg 110a. In this embodiment, the thin foil 121 is described as a thin foil made of copper (Cu).

Then, as illustrated in the area above the arrow of FIG. 3A, the first carrier-attached metal foil 120 is positioned as the lowermost layer of the support member 100 in a state having the thin foil 121 faced downward. Then, the prepreg 110a is layered on the thick foil 122 of the first carrier-attached metal foil 120. Then, the second carrier-attached metal foil 120 is layered on the prepreg 110a in a state having the thin foil 121 faced upward. It is to be noted that the aforementioned members are sequentially layered to have their centers substantially matched to each other.

Then, the prepreg 110a is cured by exerting pressure from the upper carrier-attached metal foil 120 to the side of the lower carrier-attached copper foil 120 in a state where the prepreg 110a is heated at a temperature of approximately 190° C. to 230° C. in a vacuum atmosphere. Thereby, as illustrated in the area below the arrow of FIG. 3A, the prepreg 110a is cured to become a resin layer 110 having each of the carrier-attached metal foils 120 embedded and adhered to a corresponding side of the resin layer 110.

The upper surface (upper surface of thin foil 121) of the upper carrier-attached metal foil 120 is exposed from the upper surface of the resin layer 110. The side surface of the upper carrier-attached metal foil 120 is covered by and adhered to the resin layer 110. The upper surface of the thin foil 121 of the upper carrier-attached metal foil 120 may be flush with, for example, the upper surface of the resin layer 110. Further, the lower surface (lower surface of thin foil 121) of the lower carrier-attached metal foil 120 is exposed from the lower surface of the resin layer 110. The side surface of the lower carrier-attached metal foil 120 is covered by and adhered to the resin layer 110. The lower surface of the thin foil 121 of the lower carrier-attached metal foil 120 may be flush with, for example, the lower surface of the resin layer 110. In a case where the upper surface of the thin foil 121 and the lower surface of the thin foil 121 are formed to have roughened surfaces, respectively, the average roughness (Ra) of each of the upper and lower surfaces of the thin foils 121 may be, for example, approximately 0.3 µm or more and less than 0.8 µm. In a case where the upper surface of the thin foil 121 and the lower surface of the thin foil 121 are not formed to have roughened surfaces but are formed to have smooth surfaces, the average roughness (Ra) of each of the upper and lower surfaces of the thin foils 121 may be, for example, approximately less than 0.2 µm. In this embodiment, the upper surface of the thin foil 121 and the lower surface of the thin foil 121 are described to have roughened surfaces.

In FIG. 3B, each region being surrounded by the double-dot dash line C is a region that is to become the sheet-like wiring substrate 1. That is, each region being surrounded by the double-dot dash line C corresponds to a single wiring substrate 1 that is individualized from multiple wiring substrates 1 obtained by removing the support body 100, further forming necessary layers, and cutting the resin layer 110 along the double-dot dash line C (see FIG. 3B). Each region being surrounded by the double-dot dash line C is arranged more inward than an outer edge of each of the upper and lower carrier-attached carrier foils 11 from a plan view. Although the embodiment of FIG. 3B is illustrated to have ten regions surrounded by the double-dot dash line C, the number of regions is not limited to ten.

Alternatively, a sheet-like wiring substrate including multiple wiring substrates 1 (e.g., 20 wiring substrates) may be fabricated by forming the multiple wiring substrates 1 in the regions surrounded by the double-dot dash line C and cutting the wiring substrates along the double-dot dash line C in the final stages of the manufacturing process. For the sake of convenience, one of the multiple wiring substrates 1 that is fabricated in one of the regions surrounded by the double-dot dash line C is described.

Figure 4A:
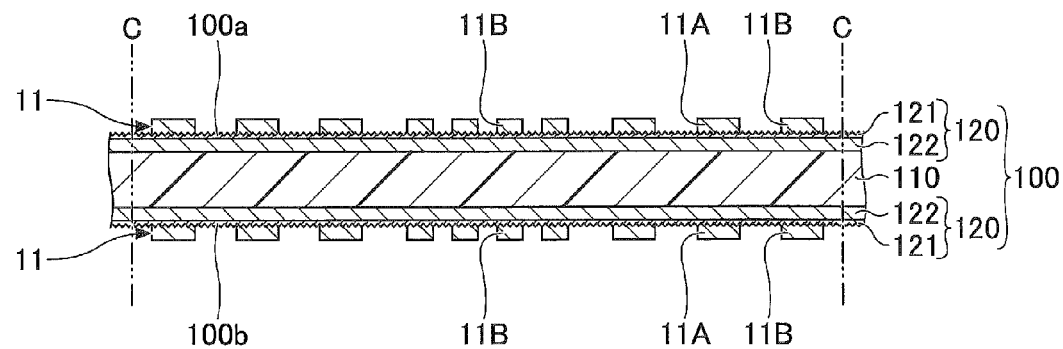

Then, in the process illustrated in FIG. 4A, the wiring layers 11 (pad body 11A and wiring pattern 11B) are formed on the one and the other surfaces 110a, 110b of the support body 100, respectively. More specifically, a resist layer including an opening corresponding to the wiring layer 11 is formed on each of the one and the other surfaces 110a, 110b of the support body 100 by using a dry film resist or the like. Then, the wiring layers 11 are formed on the one and the other surfaces 110a, 110b of the support body 100 exposed in the opening of the resist layer. For example, the wiring layers 11 may be formed by an electroplating method that uses each of the carrier-attached metal foils as power-feeding layers. In this embodiment, the material of the wiring layer 11 is described as copper (Cu).

Figure 4B:
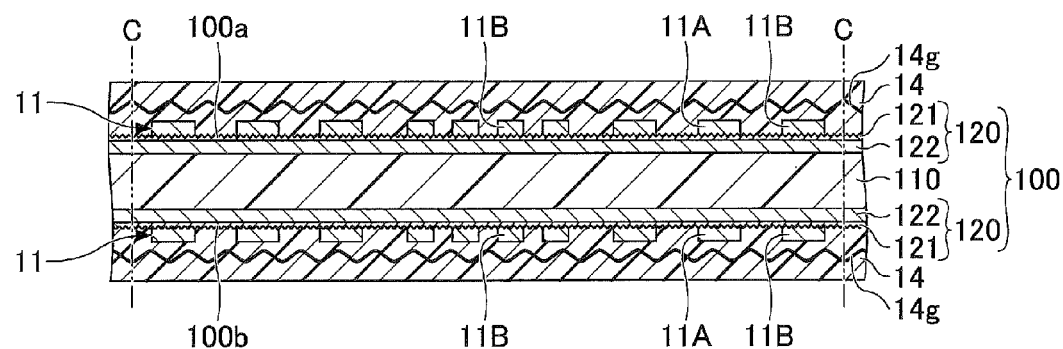

Then, in the process illustrated in FIG. 4B, the insulating layer 14 including the reinforcement member 14g is formed on each of the one and the other surfaces 100a, 100b of the support body 100 to cover each of the wiring layers 11. The insulating layer 14 may include a filler such as silica ($SiO_2$). The thickness of the insulating layer 14 may be, for example, approximately 10 µm to 50 µm. More specifically, so-called prepregs are prepared. Each prepreg is formed of a non-photosensitive thermosetting insulating resin (e.g., epoxy type resin) that is impregnated in the reinforcement member 14g. The reinforcement member 14g may be a woven or non-woven cloth made of glass fiber or an aramid fiber. The prepregs are laminated on the one and the other surfaces 100a, 100b of the support body 100, respectively. Then, each of the laminated prepregs is cured by exerting pressure thereto in a state where the insulating resin of the prepreg is heated at a temperature greater than or equal to a thermosetting temperature. Thereby, the insulating layer 14 including the reinforcement member 14g is formed. By laminating the prepreg (insulating resin) in a vacuum atmosphere, the forming of voids can be prevented.

Figure 4C:
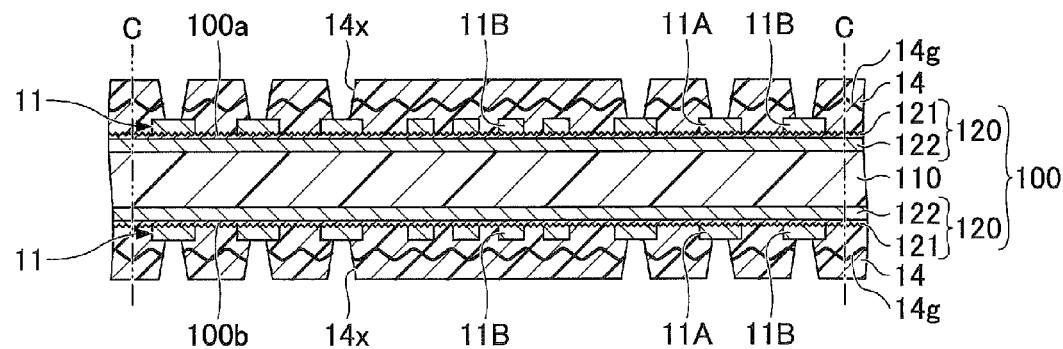

Then, in the process illustrated in FIG. 4C, the via hole 14x that penetrates each insulating layer 14 and exposes the surface of each wiring layer 11 is formed. The via hole 14x may be formed by a laser processing method using, for example, a $CO_2$ laser. After the via hole 14x is formed, it is preferable to perform a desmearing process for removing residual resin adhered to the surface of the wiring layer 11 exposed at a bottom part of the via hole 14x.

The via hole 14x that is formed by the laser processing method may be a recess including an opening on the side in which the insulating layer 16 is to be formed and a bottom surface formed by the surface of the wiring layer 11. The area of the opening on the side for forming of the insulating layer 16 is larger than the area of the bottom surface of the recess. For example, in a case where the openings on both sides of the via hole 14x is formed into circular shapes, the shape of the via hole 14x is a circular truncated cone shape when the wiring layer 11 is positioned on the upper side of the support body 11. In this case, the diameter of the opening of the via hole 14x on the side in which the insulating layer 16 is to be formed may be, for example, approximately 50 µm to 100 µm.

Figure 5A:
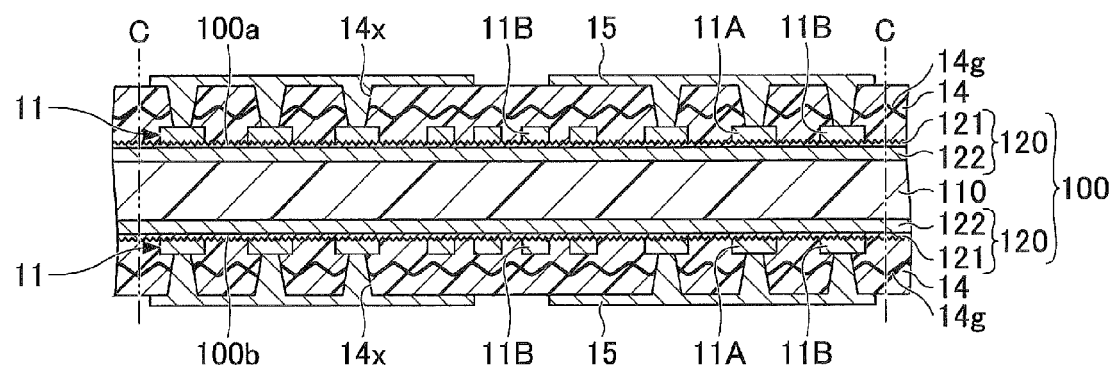

Then, in the process illustrated in FIG. 5A, the wiring layer 15 is layered on each insulating layer 14. The wiring layer 15 includes a via wiring that is filled in the via hole 14x. The wiring layer 15 also includes a wiring pattern formed on the insulating layer 14. A part of the via wiring of the wiring layer 15 that contacts the surface of the wiring layer 11 has an area smaller than an area of a part of the via wiring of the wiring layer 15 that is exposed from the surface of the insulating layer 14 (a border part of the via wiring of the wiring layer 15 between the wiring pattern of the wiring layer 15). The wiring layer 15 is electrically connected to the wiring layer 11 exposed at the bottom part of the via hole 14x. For example, copper (Cu) may be used as the material of the wiring layer 15. The thickness of the wiring pattern of the wiring layer 15 may be, for example, approximately 5 µm to 20 µm. The wiring layer 15 may be formed by using various wiring forming methods such as a semi-additive method or a subtractive method.

In a case where the wiring layer 15 is formed by using a semi-additive method, first, a seed layer (not illustrated) made of copper (Cu) or the like is formed by using an electroless plating method or a sputtering method. The seed layer is formed on surface of the wiring layer 11 exposed at the bottom part of the via hole 14x and the entire surface of the wiring layer 14 including the inner wall surface of the via hole 14x. Then, a resist layer (not illustrated) including an opening part corresponding to the wiring layer 15 is formed on the seed layer. Then, an electroplating layer (not illustrated) made of copper (Cu) or the like is formed in the opening of the resist layer. The electroplating layer is formed by an electroplating method using the seed layer as a power-feeding layer. Then, after removing the resist layer, the electroplating layer is used as a mask to etch (remove) a part of the seed layer that is not covered by the electroplating layer. Thereby, the wiring layer 15 having the electroplating layer layered on the seed layer is formed.

Then, in the process illustrated in FIG. 53, the insulating layer 16 including the reinforcement member 16g that covers the wiring layer 15 is formed on the insulating layer 14 by performing the same processes illustrated in FIGS. 43 to 5A. Then, the via hole 16x is formed in the insulating layer 16, and the wiring layer 17 is formed on the insulating layer 16. The wiring layer 17 is electrically connected to the wiring layer 15 by way of the via hole 16x.

Figure 5B:
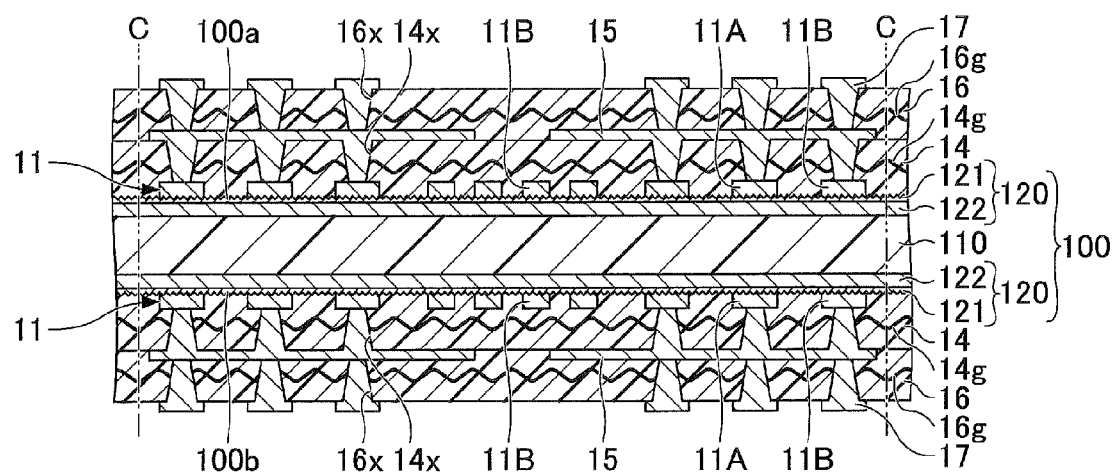
Figure 6A:
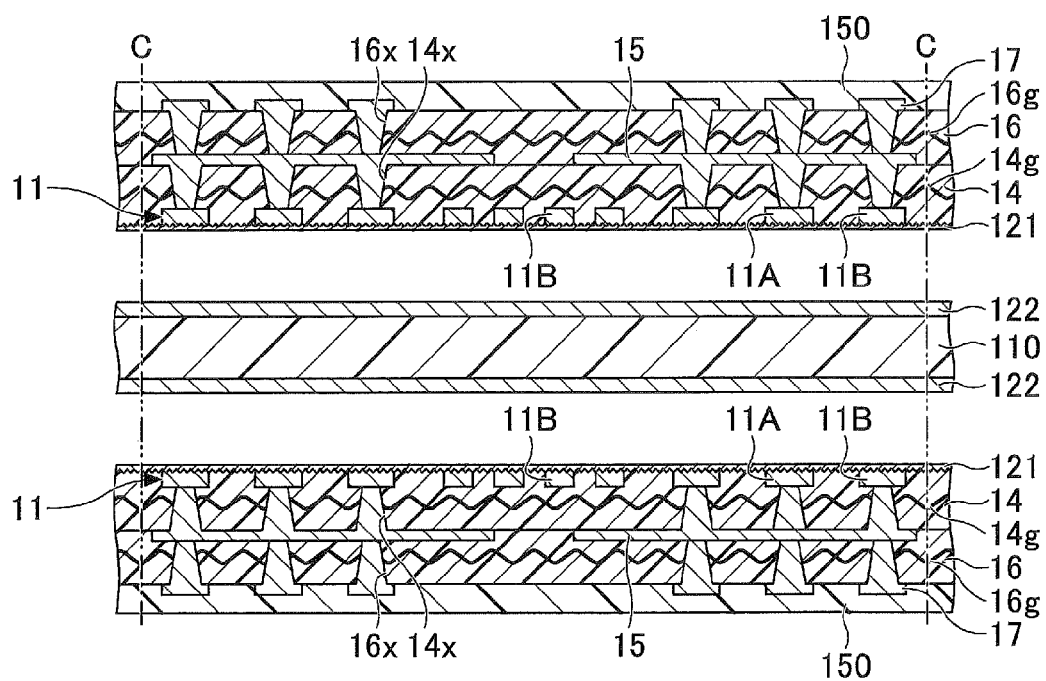

Then, in the process illustrated in FIG. 6A, a part of the support body 100 is removed from the structural body illustrated in FIG. 5B. More specifically, first, a protective film 150 (e.g., resin film) that covers the wiring layer 17 is laminated on each insulating layer 16. Then, the support body 100 and the wiring members layered on both surfaces of the support body 100 are cut by using a router or the like. The support body 100 and the wiring members are cut at an area that is more inward than an outer edge of each carrier-attached metal foil 120 but more outward than each region surrounded by the double-dot dash line C from the plan view illustrated in FIG. 32. Thus, a part of the support body 100 is removed from the structural body illustrated in FIG. 5B at an area in which the side surface of the carrier-attached metal foil 120 and the resin layer 110 are adhered to each other. Accordingly, the support body 100 and the wiring members layered on the support body 100 are held together only by the adhesive force between the thin foil 121 and the thick foil 122.

Then, the thin foil 121 and the thick foil 122 of each carrier-attached metal foil 120 are peeled at an interface between the thin foil 121 and the thick foil 122 by exerting mechanical force to the support body 100.

Because the carrier-attached metal foil 120 has a structure in which the thick foil 122 is peelably adhered to the thin foil 121 by way of a peeling layer (not illustrated) as described above, the thick foil 121 can be easily peeled from the thin foil 121 together with the peeling layer.

Accordingly, only the thin foil 121 remains on the side of the insulating layer 14 of each whereas the other members included in the support member 100 (members of the support member 100 other than the thin foil 121) are removed. Other than a case where the thick foil 122 is peeled from the thin foil 121 together with the peeling layer, the thick foil 122 may peel from the thin foil 121 when cohesion failure occurs in the peeling layer. Further, the thick foil 122 may peel from the thin foil 121 by the thick foil 122 peeling from the peeling layer.

In this process, two wiring members, each of which having the thin foil 121 formed on the side of the insulating layer 14, are obtained. However, for the sake of convenience, the following processes are described for only one of the two wiring members. Nevertheless, the following processes are also performed on the other one of the two wiring members.

Figure 6B:
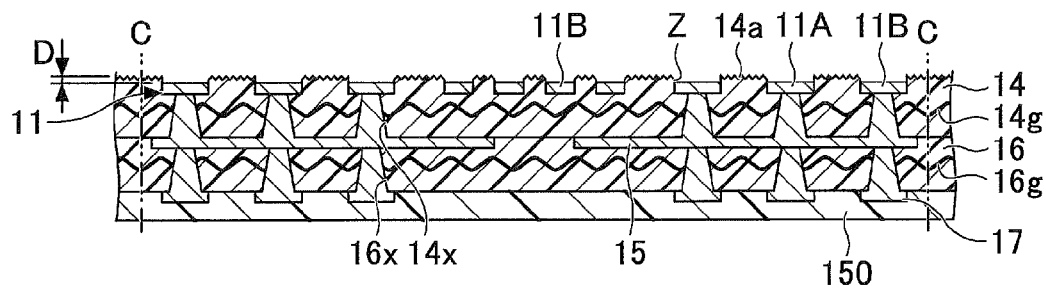

Then, in the process illustrated in FIG. 6B, the thin foil 121 is removed by etching to expose the upper surface 14a of the insulating layer 14. The thin foil 121 made of copper may be removed by a wet-etching method using, for example, a hydrogen peroxide/sulfuric acid solution, a sodium persulfate solution, or an ammonium persulfate solution. Because the wiring layer 11 is also made of copper, a part of the upper surface of the wiring layer 11 is removed by the etching. Thereby, a step part Z is formed between the upper surfaces 11u, 11w of the wiring layer 11 and the upper surface 14a of the insulating layer 14. Thereby, the upper surfaces 11u, 11w of the wiring layer 11 are exposed at areas that are recessed relative to the upper surface 14a of the insulating layer 14.

The upper surface 11w of the pad body 11A and the upper surface 11u of the wiring pattern 11B are etched to be positioned on substantially the same plane. The depths D of the step parts Z from the upper surfaces 11u, 11w of the wiring layer 11 (upper surface 11w of the pad body 11A and the upper surface 11u of the wiring pattern B) may be, for example, approximately 2 μm to 4 μm. The depth D of the step part Z may be adjusted to a given value by controlling the etching time. Because the wiring layer 17 is covered by the protective film 150, the wiring layer 17 is prevented from being partly or entirely removed by the etching of the thin foil 121 and a portion of the wiring layer 11.

As described above, the surface of the thin foil 121 that contacts the wiring layer 11 and the insulating layer 14 has a roughened surface (e.g., average roughness (Ra) of approximately 0.3 μm or more and less than 0.8 μm). Therefore, the roughened surface of the thin foil 121 is transferred to the upper surface 14a of the insulating layer 14. On the other hand, the surface of the wiring layer 11 that had been contacting the roughened surface of the thin foil 121 is removed by etching. Therefore, The exposed upper surfaces 11u, 11w of the wiring layer 11 that are recessed relative to the upper surface 14a of the insulating layer 14 have smoothened surfaces (e.g., average roughness (Ra) of approximately 0.05 μm or more and less than 0.2 μm).

Figure 7A:
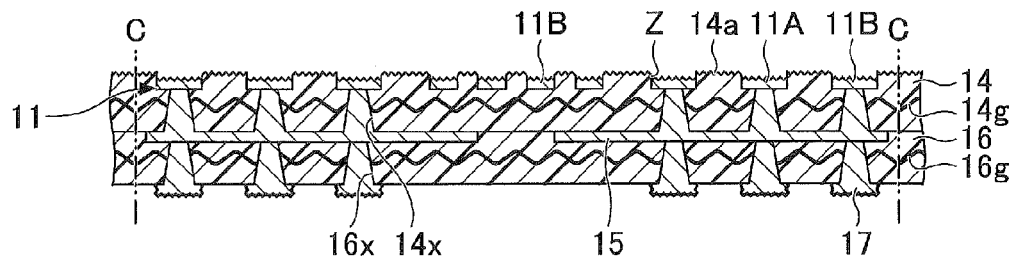

Then, in the process illustrated in FIG. 7A, the upper surfaces 11u, 11w of the wiring layer 11 exposed from the upper surface 14a of the insulating layer 14 and the lower and side surfaces of the wiring layer 17 exposed from the lower surface of the insulating layer 16 are roughened after removing the protective film 150 illustrated in FIG. 6B. The roughening of the exposed surfaces of the wiring layers 11, 17 may be performed by, for example, a wet-etching method using formic acid.

The average roughness (Ra) of the exposed surfaces of the wiring layers 11, 17 may be, for example, approximately 0.3 μm or more and less than 0.8 μm.

Figure 7B:
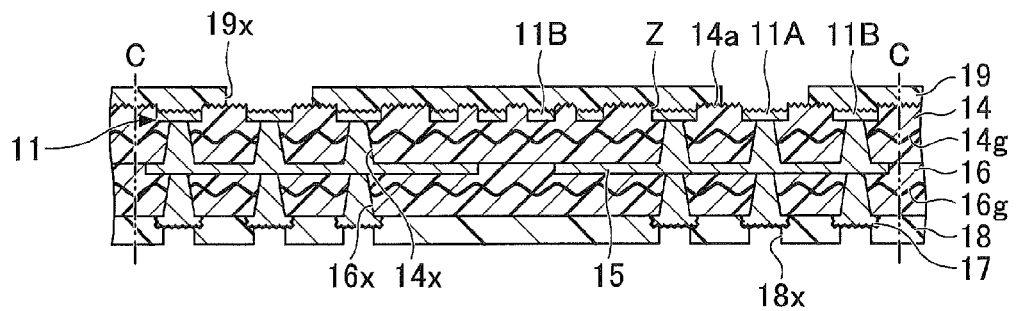

Then, in the process illustrated in FIG. 7B, the solder resist layer 19 that covers the wiring layer 11 is formed on the upper surface 14a of the insulating layer 14. Further, the solder resist layer 18 that covers the wiring layer 17 is formed on the lower surface of the insulating layer 16. For example, a liquid or paste-like insulating resin may be applied on the insulating layers 14, 16 to cover the wiring layers 11, 17 by using a screen-printing method, a roll-coating method, or a spin-coating method. Alternatively, a film-like insulating resin may be laminated on the insulating layers 14, 16 to cover the wiring layers 11, 17. For example, a photosensitive insulating resin having a phenol type resin or a polyimide type resin as a main component may be used as the insulating resin.

Then, the opening 19x that exposes the pad body 11A of the wiring layer 11 is formed in the solder resist layer 19 by exposing and developing the applied or laminated insulating resin (photolithography method). In this embodiment, the opening 19x is formed at the periphery of the pad body 11A from a plan view, so that the upper surface 14a of the insulating layer 14 is exposed. Similarly, the opening 18x is formed in the solder resist layer 18 to selectively expose the wiring layer 17 (photolithography method). In this embodiment, the opening 18x is formed, so that an outer edge part of the lower surface 17t of the wiring layer 17 is covered by the solder resist layer 18 and a center part of the lower surface 17t of the wiring layer 17 is exposed from the solder resist layer 18. The openings 19x, 18x may be formed by, for example, a laser processing method or a blasting method in a case where a non-photosensitive insulating resin (thermosetting resin) having an epoxy type resin or a polyimide type resin as a main component is used as the solder resist layers 19, 18.

The step part Z that is formed by the upper surface 14a of the insulating layer 14 and the upper surface 11u of the wiring pattern 11B is buried by the solder resist layer 19. The adhesiveness between the wiring pattern 11B and the solder resist layer 19 becomes satisfactory owing to an anchor effect caused by the above-described roughened surface of the upper surface 11u of the wiring pattern 11B. Similarly, the adhesiveness between the outer edge part 17s of the lower surface 17t and the side surface 17v of the wiring layer 17 (see FIG. 1D) and the solder resist layer 18 becomes satisfactory owing to an anchor effect caused by the roughened surfaces of the outer edge part 17s of the lower surface 17t and the side surface 17v of the wiring layer 17.

Figure 7C:
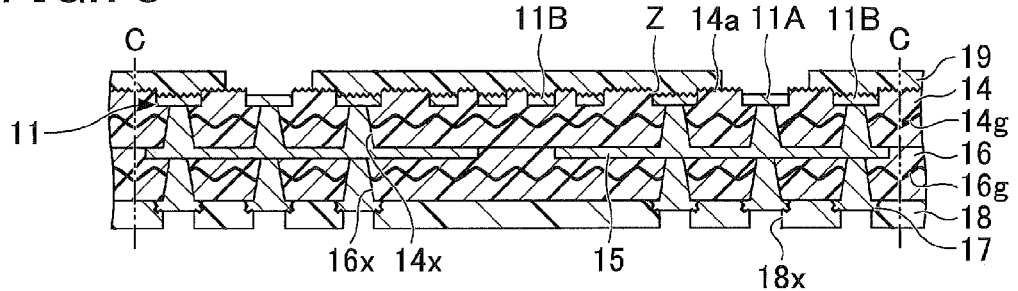

Then, in the process illustrated in FIG. 7C, an etching process is performed on the upper surface 11w (roughened surface) of the pad body 11A that is exposed from the opening 19x of the solder resist layer 19, so that the exposed upper surface 11w of the pad body 11A is formed into a smooth surface (e.g., etching) before the forming of the first and second metal layers 12, 13. Further, an etching process is also performed on the center part 17p of the lower surface 17t (roughened surface) of the wiring layer 17 that is exposed from the opening 18x of the solder resist layer 18, so that the exposed center part 17p of the lower surface 17t of the wiring layer 17 is formed into a smooth surface. The average roughness (Ra) of the upper surface 11w of the pad body 11A exposed in the opening 19x of the solder resist layer 19 and the average roughness (Ra) of the center part 17p of the lower surface 17t of the wiring layer 17 exposed from the opening 18x of the solder resist layer 18 may be, for example, approximately 0.05 μm or more and less than 0.2 μm, respectively. For example, a hydrogen peroxide/sulfuric acid solution, a sodium persulfate solution, or an ammonium persulfate solution may be used as an etching liquid for performing the etching process.

Figure 7D:
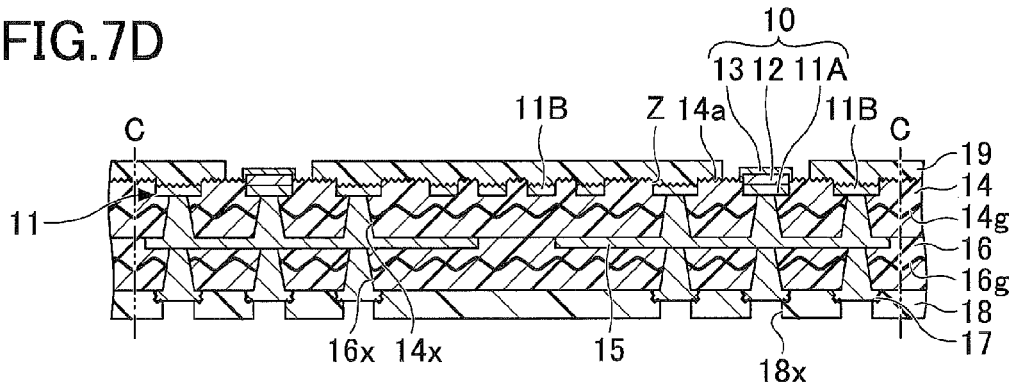

Then, in the process illustrated in FIG. 7D, the pad 10 is fabricated by sequentially layering the first and second metal layers 12, 13 on the upper surface 11w of the pad body 11A that is exposed from the opening 19x of the solder resist layer 19. The first and second metal layers 12, 13 may be formed by, for example, an electroplating method or an electroless plating method. In a case of using the electroplating method, a bus line is to be formed beforehand, so that electric power can be fed to the pad body 11A from the outside.

The first metal layer 12 is formed to include the embedded part 12-1 embedded in the insulation layer 14 and the projecting part 12-2 projecting from the upper surface 14a of the insulating layer 14. That is, the first metal layer 12 has a part of the side surface 12v embedded in the insulating layer 14 and another remaining part of the side surface 12v exposed from the insulating layer 14. More specifically, the embedded part 12-1 is formed by having the lower surface 12t of the first metal layer 12 contact the upper surface 11w of the pad body 11A and having a lower end side (i.e., side toward the pad body 11A) of the side surface 12v of the first metal layer 12 contact and be covered by the insulating layer 14. Further, the projecting part 12-2 is formed by having an upper end side (i.e., side toward the second metal layer 13) of the side surface 12v of the first metal layer 12 and the upper surface 12u of the first metal layer 12 exposed from the insulating layer 14. The embedded part 12-1 and the projecting part 12-2 are formed of the same material and are integrally (continuously) formed.

For example, nickel (Ni) may be used as the material of the first metal layer 12. The thickness of the first metal layer 12 may be, for example, approximately 3 μm to 10 μm. The height H of the upper surface 12u of the first metal layer (see FIG. 1B) from the upper surface 14a of the insulating layer 14 may be, for example, approximately 1 μm to 4 μm. The first metal layer 12 may be formed to have the cross-section illustrated in FIG. 1B or FIG. 10.

The second metal layer 13 is formed to cover the projecting part 12-2 of the first metal layer 12 (exposed part of the first metal layer 12 projecting from the upper surface 14a of the insulating layer 14) and the side surface 12v of the first metal layer 12. For example, gold (Au) may be used as the material of the second metal layer 13. The thickness of the second metal layer 13 may be, for example, approximately 0.06 μm to 1 μm. The upper surface 13u of the second metal layer 13 is positioned lower than the upper surface 19a of the solder resist layer 19. The height (vertical) difference between the upper surface 13u of the second metal layer 13 and the upper surface 19a of the solder resist layer 19 may be, for example, approximately 3 μm to 10 μm.

In this process of FIG. 7D, a surface processed layer (not illustrated) may be formed on the center part 17p of the lower surface 17t of the wiring layer 17 exposed at the bottom part of the opening 18x. For example, an electroplating method or an electroless plating method may be used to form the surface processed layer. An example of the surface processed layer is described above.

After the process illustrated in FIG. 7D, the structural body illustrated in FIG. 7D is cut along the double-dot dash line C by using a slicer or a router. Thereby, the manufacturing of multiple wiring substrates (see FIG. 1A) is completed.

Accordingly, with the wiring substrate 1 according to the first embodiment of the present invention, the pad 11A is embedded in the insulating layer 14, and the upper surface 11w of the pad body 11A is exposed at a part of the insulating layer 14 that is recessed relative to the upper surface 14a of the insulating layer 14. Further, the first metal layer 12 including the embedded part 12-1 embedded in the insulating layer 14 and the projecting part 12-2 projecting from the upper surface 14a of the insulating layer 14 is formed on the upper surface 11w of the pad body 11A. Further, the second metal layer 13 that covers the upper surface 12u of the projecting part 12-2 and the side surface 12v of the first metal layer 12 is formed. Thereby, the pad 10 is formed.

Because a part of the first metal layer 12 is embedded in the insulating layer 14, the height difference between the upper surface 14a of the insulating layer 14 and the upper surface 13u of the second metal layer 13 (e.g., a few μm) can be less compared to that of a related art example (e.g., 15 μm to 50 μm). As a result, even in a case where the solder resist layer 19 for protecting the pad 10 is formed, the solder resist layer 19 can be formed to have a thickness (e.g., 5 μm to 15 μm) that is less than a thickness of a related art example (e.g., 20 μm to 60 μm). Accordingly, thickness reduction of the wiring substrate 1 can be achieved. The thickness of each of the layers included in the wiring substrate 1 and the total thickness of the wiring substrate 1 are described in further detail in the following practical examples.

Further, in this embodiment, the first metal layer 12 can be formed with a sufficient thickness because a part of the first metal layer 12 is embedded in the insulating layer 14. Thus, in a case where the first metal layer 12 is formed of nickel, connection reliability (wettability) for performing wire-bonding or flip-chip bonding can be prevented from degrading. When the first metal layer 12 made of copper is thinly formed in a case where the pad body 11A is made of copper, the nickel layer formed at the side surface of the copper layer becomes particularly thin and is unable to sufficiently provide a barrier effect. As a result, copper may spread to the solder formed on the pad body 11A. However, in this embodiment, copper can be prevented from spreading to the solder formed on the pad 10 because the side surface 11A of the pad body 11A is embedded in the insulating layer 14.

Further, in this embodiment, because the upper surface 11w of the pad body 11A is a smooth surface, the upper surface 12u of the first metal layer 12 and the upper surface 13u of the second layer 13 that are formed on the upper surface 11w of the pad body 11A also become smooth surfaces. Further, the thickness of the first metal layer 12 and the thickness of the second metal layer 13 become even. Thereby, for example, wettability can be improved when connecting a bonding wire to the upper surface 13u of the second metal layer 13 or connecting an electrode pad of a semiconductor chip by way of solder. Thus, connection reliability can be improved.

Conventionally, in a case of forming a pad body, it is necessary to perform the processes of forming a seed layer that covers an upper surface of an insulating layer, selectively forming an electroplating layer on the seed layer by performing an electroplating method, and removing a part of the seed layer that is not covered by the electroplating layer by performing an etching process. When performing the conventional processes, it is necessary to anticipate the amount to be removed (etching area) and form the electroplating layer with a large diameter because a part of the side surface of the electroplating layer is removed during the process of removing the seed layer. Therefore, it is difficult to form the pad bodies with a narrow pitch (reducing the pitch of the pads). On the other hand, according to the above-described embodiment of the present invention, there is no process that causes the side surface 11v of the pad body 11A to be removed by etching because the pad body 11A is embedded in the insulating layer 14 (side surface 11v of the pad body 11A being covered by the insulating layer 14). Accordingly, there is no need to anticipate the etching area when forming the pad body 11A. Thus, the pitch of the pad bodies 11A can be reduced (reduction of the pitch of the pads 10).

Further, because the pad body 11A or the side surface 11v of the wiring pattern 11B is partly removed when removing a seed layer with a conventional method, problems such as the thinning of the wiring, the increase of resistance, or electro-migration occur. On the other hand, according to the above-described embodiment of the present invention, problems such as the increasing of resistance or electro-migration can be prevented because the pad body 11A is embedded in the insulating layer 14.

The conventional pad body that is formed by the seed layer and the electroplating layer projects from the upper surface of the insulating layer. In a case where a nickel plating is used to form a first metal layer on the pad body projecting from the upper surface of the insulating layer, the nickel plating is formed on the upper and side surfaces of the pad body. Therefore, it becomes necessary to consider the thickness of the nickel plating formed on the side surface of the pad body and widen the intervals between adjacent pad bodies. Thus, reduction of the pitch of the pad bodies (reduction of the pitch of pads) is difficult.

On the other hand, according to the above-described embodiment of the present invention, because the pad body 11A is embedded in the insulating layer 14 (side surface 11v of the pad body 11A being covered by the insulating layer 14), the first metal layer can be prevented from being formed on the side surface 11v of the pad body 11A. Accordingly, the interval between adjacent pad bodies 11A can be determined without having to consider the thickness of the nickel plating formed on the side surface 11v of the pad body 11A. Thus, the pitch of the pad bodies 11A can be reduced (reduction of the pitch of the pads 10). Further, according to the above-described embodiment of the present invention, because the side surface 11v of the pad body 11A is embedded in the insulating layer 14, the side surface 11V of the pad body 11A is prevented from contacting solder. Therefore, there is no concern regarding the barrier effect.

Although the outer peripheral part 12s of the projecting part 12-2 of the first metal layer 12 is formed extending to the upper surface 14a of the insulating layer 14 as illustrated in FIG. 1C, the width of the extending part is significantly small compared to the thickness of the nickel plating that is formed on the side surface of the pad body by a conventional method. Therefore, the extending part hardly affects the reduction of the pitch of the pad bodies 11A (reduction of the pitch of the pads 10). Further, although the second metal layer 13 is also formed on the side surface 12v of the first metal layer 12, the thickness of the second metal layer 13 is significantly small compared to the thickness of the nickel plating that is formed on the side surface of the pad body by a conventional method. Therefore, the second metal layer 13 hardly affects the reduction of the pitch of the pad bodies 11A (reduction of the pitch of the pads 10).

Further, according to the above-described embodiment of the present invention, the strength against detachment or peeling of the pad body 11A can be improved compared to a conventional method where the pad body having the seed layer and the electroplating layer are formed on the upper surface of the insulating layer.

Further, with the conventional wiring substrate, only the pad is formed on the outermost insulating layer formed of a non-photosensitive insulating layer and the wiring pattern is formed on another layer by way of the via wiring. However, due to the increase of terminals to be mounted on the semiconductor device and the increase of semiconductor devices to be mounted, wirings are to be formed with high densities. Accordingly, it becomes necessary to increase the number of layers on which wiring patterns are to be formed. On the other hand, with the above-described embodiment of the present invention, the pad 10 and the wiring pattern 11B are formed on the same plane of the insulating layer 14 (side of the upper surface 14a of the insulating layer 14). Accordingly, because a wiring pattern is also formed on the outermost insulating layer, the number of layers for forming the wiring pattern can be reduced. Thus, a thin wiring substrate that can accommodate the increase of terminals to be mounted on the semiconductor device and the increase of semiconductor devices to be mounted can be achieved.

Further, the wiring pattern 11B is formed in an area of the insulating layer 14 that is recessed relative to the upper surface 14a of the insulating layer 14 that is the same layer on which the pad 10 is formed (outermost insulating layer on which the wiring is formed). That is, irregularities formed by the recesses of the wiring pattern 11B are formed on the upper surface 14a of the insulating layer 14. Therefore, the adhesiveness of the insulating layer 14 and the solder resist layer 19 can be improved not only by the roughened surface of the upper surface of the upper surface 14a of the insulating layer 14a but also by increased contact area of the solder resist layer and the insulating layer 14 including the irregularities formed by the recesses of the wiring pattern 11B. As a result, the solder resist layer 19 can be prevented from peeling from the insulating layer 14.

Further, the pad 10 can be protected from physical damage and electrical damage owing to the solder resist layer 19 being formed on the side of the semiconductor mounting surface and the upper surface 19a of the solder resist layer 19 being formed lower than the upper surface of the pad 10 (upper surface 13u of the second metal layer 13).

<Second embodiment>

In the second embodiment of the present invention, a wiring substrate including an insulating layer that has no reinforcement member is described. In the second embodiment, like components and parts are denoted with like reference numerals of the first embodiment and are not further described.

Figure 8:
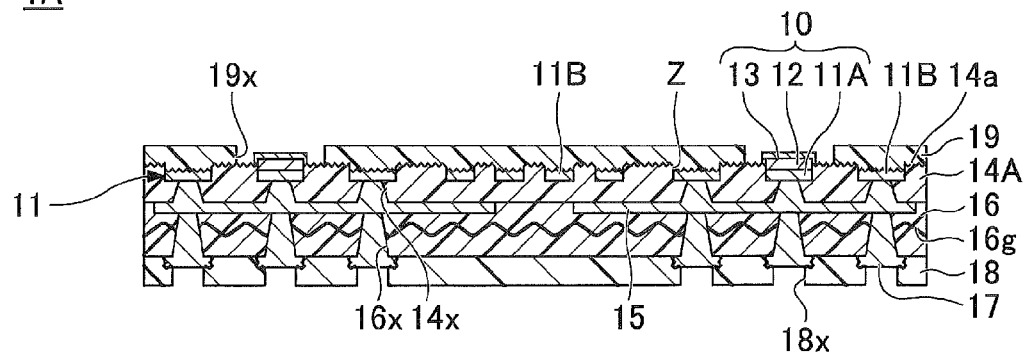
FIG. 8 is a cross-sectional view illustrating a wiring substrate according to a second embodiment of the present invention.

FIG. 8 is a cross-sectional view illustrating an example of a wiring substrate 1A according to the second embodiment of the present invention. With reference to FIG. 8, the wiring substrate 1A of the second embodiment is different from the wiring substrate 1 of the first embodiment in that the wiring substrate 1A includes an insulating layer 14A that has no reinforcement member 14g (see FIG. 1A).

Accordingly, because the wiring substrate 1A of the second embodiment includes the insulating layer 14A that has no reinforcement member 14g, the insulating layer 14A having no reinforcement member 14g can be formed thinner than the insulating layer 14 that has the reinforcement member 14g. Therefore, the total thickness of the wiring substrate 1A can be less than the total thickness of the wiring substrate 1. The thicknesses of each layer of the wiring substrate 1A and the total thickness of the wiring substrate 1A are described in detail in the following practical examples. Other effects attained by the wiring substrate 1A are the same as those of the wiring substrate 1 of the first embodiment.

<Third embodiment>

In the third embodiment of the present invention, a wiring substrate including four wiring layers is described. In the third embodiment, like components and parts are denoted with like reference numerals of the first embodiment and are not further described.

Figure 9:
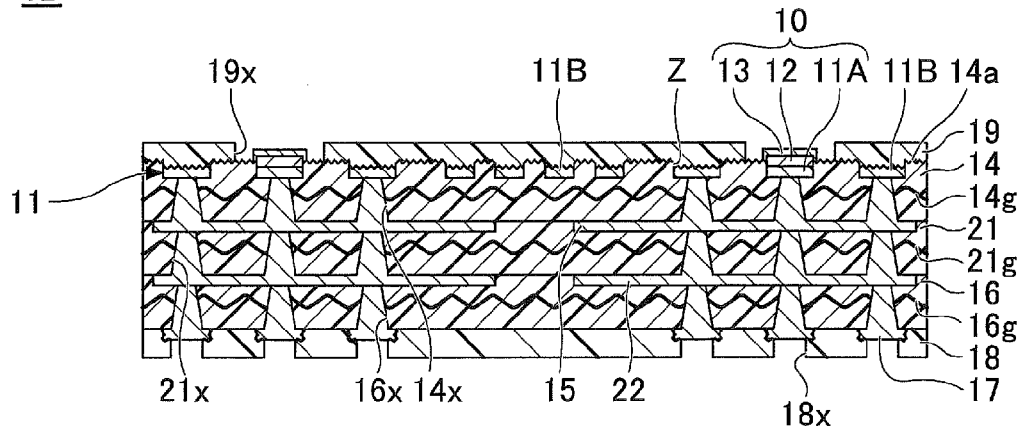
FIG. 9 is a cross-sectional view illustrating a wiring substrate according to a third embodiment of the present invention.

FIG. 9 is a cross-sectional view illustrating an example of a wiring substrate 1B according to the third embodiment of the present invention. With reference to FIG. 9, the wiring substrate 1B of the third embodiment is different from the wiring substrate 1 of the first embodiment in that an insulating layer 21 and a wiring layer 22 are added between the wiring layer 15 and the insulating layer 16 (see FIG. 1A).

In the wiring substrate 1B, the insulating layer 21 is formed on the lower surface of the insulating layer 14 to cover the wiring layer 15. The same insulating resin used for forming the insulating layer 14 may be used to form the insulating layer 21. In this embodiment, the insulating layer 21 includes a reinforcement member 21g. The reinforcement member 21g may be, for example, a woven or non-woven fabric such as glass fabric or an aramid fabric. The insulating layer 21 may include a filler such as silica ($SiO_2$). The thickness of the insulating layer 21 may be, for example, approximately 10 μm to 50 μm.

The wiring layer 22 is formed on the side of the lower surface of the insulating layer 21. The wiring layer 22 includes a via wiring filled in a via hole 21x that penetrates the insulating layer 21 and exposes a lower surface of the wiring layer 15. The wiring layer 22 also includes a wiring pattern formed on the lower surface of the insulating layer 21. The via hole 21x may be a recess including one opening on a side of the insulating layer 16 and another opening exposing a lower surface of the wiring layer 15 in which the one opening has an area that is larger than the area of the bottom surface of the other opening. For example, in a case where the openings on both sides of the via hole 21x are circular shapes, the via hole 21x is a recess having a circular truncated cone shape.

That is, a part of the via wiring of the wiring layer 22 that contacts the lower surface of the wiring layer 15 has an area smaller than an area of a part of the via wiring of the wiring layer 22 that is exposed from the lower surface of the insulating layer 21 (a border part of the via wiring of the wiring layer 22 between the wiring pattern of the wiring layer 22).

The wiring layer 22 is electrically connected to the wiring layer 15 exposed at a bottom part of the via hole 21x. For example, copper (Cu) may be used as the material of the wiring layer 22. The thickness of the wiring pattern of the wiring layer 22 may be, for example, approximately 5 μm to 20 μm.

The insulating layer 16 is formed on the lower surface of the insulating layer 21 to cover the wiring layer 22. The wiring layer 17 is electrically connected to the wiring layer 22 exposed at the bottom part of the via hole 16x.

Accordingly, the wiring substrate 1B of the third embodiment includes four wiring layers. The wiring substrate 1B can be formed to have a total thickness that is substantially the same as the total thickness of the wiring substrate 1 including three wiring layers by adjusting the thickness of, for example, each wiring layer or the solder resist layer. The thicknesses of each layer of the wiring substrate 1B and the total thickness of the wiring substrate 1B are described in detail in the following practical examples. Other effects attained by the wiring substrate 1A are the same as those of the wiring substrate 1 of the first embodiment.

<First applied Eeample of first embodiment>

In the first applied example of the first embodiment, a semiconductor package having a semiconductor chip (semiconductor device) mounted (wire-bonded) on the wiring substrate 1 of the first embodiment is described. In the first applied example of the first embodiment, like components and parts are denoted with like reference numerals of the first embodiment and are not further described.

Figure 10:
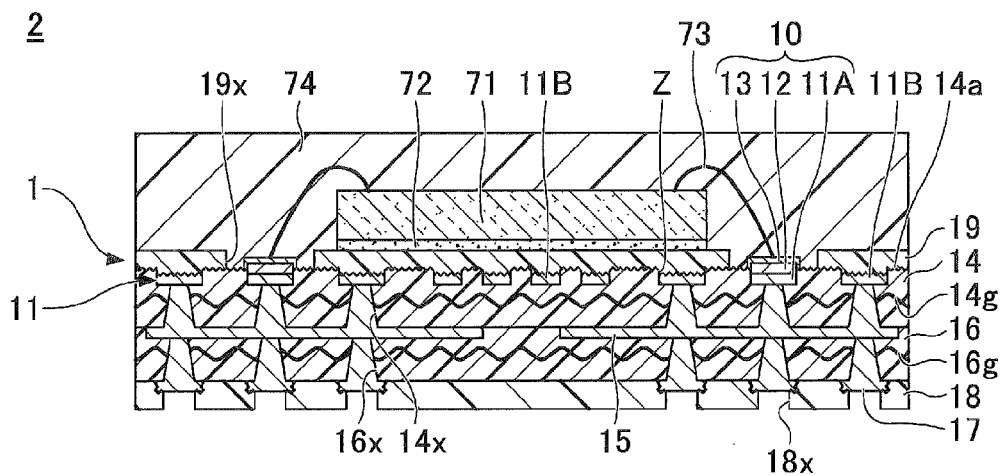
FIG. 10 is a cross-sectional view illustrating a semiconductor package of a first applied example of the first embodiment.

FIG. 10 is a cross-sectional view illustrating a semiconductor package 2 according to the first applied example of the first embodiment. With reference to FIG. 10, the semiconductor package 2 includes the wiring substrate 1 illustrated in FIG. 1A, a semiconductor chip 71, an adhesive layer 72, a bonding wire 73, and a encapsulating layer 74. In the semiconductor package 2, the semiconductor chip 71 is to be mounted on the side of the solder resist layer 19 of the wiring substrate 1 (semiconductor device mounting surface).

The semiconductor chip 71 may be, for example, a semiconductor integrated circuit (not illustrated) formed on a thinned semiconductor substrate (not illustrated) made of silicon or the like. An electrode pad (not illustrated) that is electrically connected to the semiconductor integrated circuit (not illustrated) is formed on the semiconductor substrate (not illustrated).

The semiconductor chip 71 that is in a face-up state is mounted on the solder resist layer 19 of the wiring substrate 1 by way of the adhesive layer 72. The bonding wire 73 electrically connects an electrode pad (not illustrated) of the semiconductor chip 71 and the pad 10 (upper surface 13u of second metal layer 13) of the wiring substrate 1. More specifically, the bonding wire 73 may be, for example, a gold wire or a copper wire. One end of the bonding wire 73 is welded and bonded to the electrode pad of the semiconductor chip 71 whereas the other end of the bonding wire 73 is welded and bonded to the pad 10 of the wiring substrate 1. The encapsulating resin 74 is formed to cover the semiconductor chip 71, the adhesive layer 72, and the bonding wire 73.

Accordingly, by mounting the semiconductor chip 71 on the wiring substrate 1 of the first embodiment, the semiconductor package 2 is fabricated. In this process of mounting the semiconductor chip 71 on the wiring substrate 1, the wettability is satisfactory when welding the bonding wire 73 because the upper surface 13u of the second metal layer 13 of the pad 10 of the wiring substrate 1 is a smooth surface and the thickness of the second metal layer 13 is even. Thus, the connection reliability between the pad 10 and the bonding wire 73 can be improved.

<Second applied example of first embodiment

The second applied example of the first embodiment illustrates a semiconductor package 2A having a semiconductor chip (semiconductor device) 75 mounted (flip-chip bonded)

on the wiring substrate 1. In the second applied example of the first embodiment, like components and parts are denoted with like reference numerals of the first embodiment and are not further described.

Figure 11:
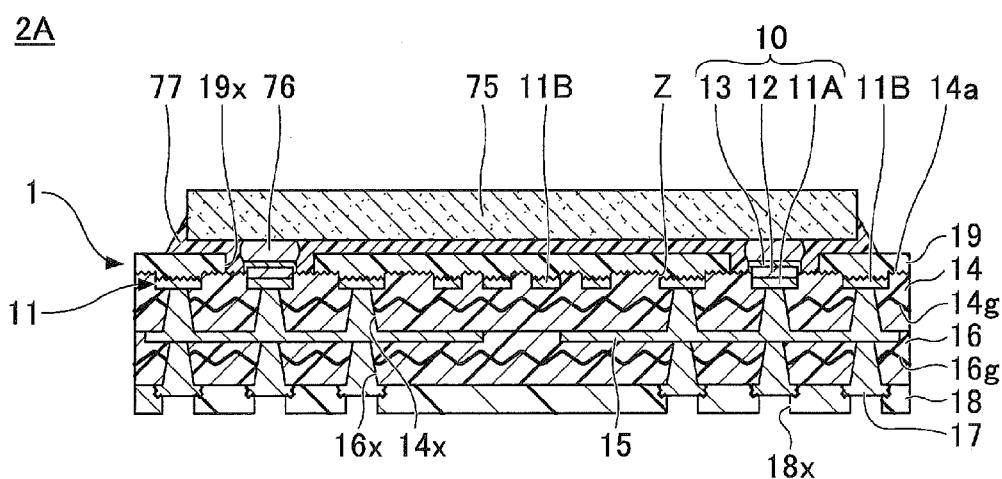
FIG. 11 is a cross-sectional view illustrating a semiconductor package of a second applied example of the first embodiment.

FIG. 11 is a cross-sectional view of the semiconductor package 2A of the second applied example of the first embodiment. With reference to FIG. 11, the semiconductor package 2A includes the wiring substrate 1 of FIG. 1, the semiconductor chip 75, a bump 76, and an underfill resin 77. In the semiconductor package 2A, the semiconductor chip 75 is to be mounted on the side of the solder resist layer 19 of the wiring substrate 1 (semiconductor device mounting surface).

The semiconductor chip 75 may be, for example, a semiconductor integrated circuit (not illustrated) formed on a thinned semiconductor substrate (not illustrated) made of silicon or the like. An electrode pad (not illustrated) that is electrically connected to the semiconductor integrated circuit (not illustrated) is formed on the semiconductor substrate (not illustrated).

The semiconductor chip 75 that is in a face-down state is mounted on the solder resist layer 19 of the wiring substrate 1 by way of the bump 76. The bump 76 that is formed of solder material or the like electrically connects an electrode pad (not illustrated) of the semiconductor chip 75 and the pad 10 (upper surface 13u of second metal layer 13) of the wiring substrate 1. The underfill resin 77 is supplied between the semiconductor chip 75 and the upper surface of the wiring substrate 1.

Accordingly, by flip-chip bonding the semiconductor chip 75 on the wiring substrate 1 of the first embodiment, the semiconductor package 2A is fabricated. In this process of flip-chip bonding the semiconductor chip 75 on the wiring substrate 1, the solder material or the like that constitutes the bump 76 has a satisfactory wettability because the upper surface 13u of the second metal layer 13 of the pad 10 of the wiring substrate 1 is a smooth surface and the thickness of the second metal layer 13 is even. Thus, the connection reliability between the pad 10 and the electrode pad of the semiconductor chip 75 can be improved.

<Third applied example of first embodiment>

The third applied example of the first embodiment illustrates a semiconductor package having multiple semiconductor chips (semiconductor devices) mounted (flip-chip bonded) on a wiring substrate 1C that is to become a semiconductor package. In the third applied example of the first embodiment, like components and parts are denoted with like reference numerals of the first embodiment and are not further described.

Figure 12A:
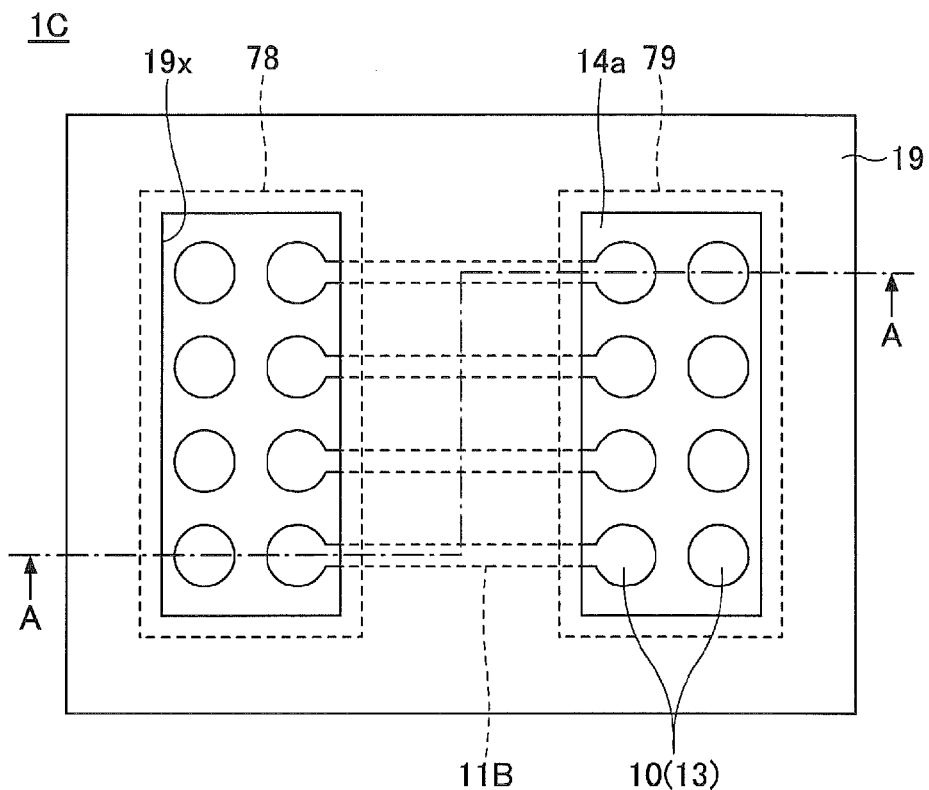
FIGS. 12A and 12B are schematic diagrams illustrating a wiring substrate of a third applied example of the first embodiment.
Figure 12B:
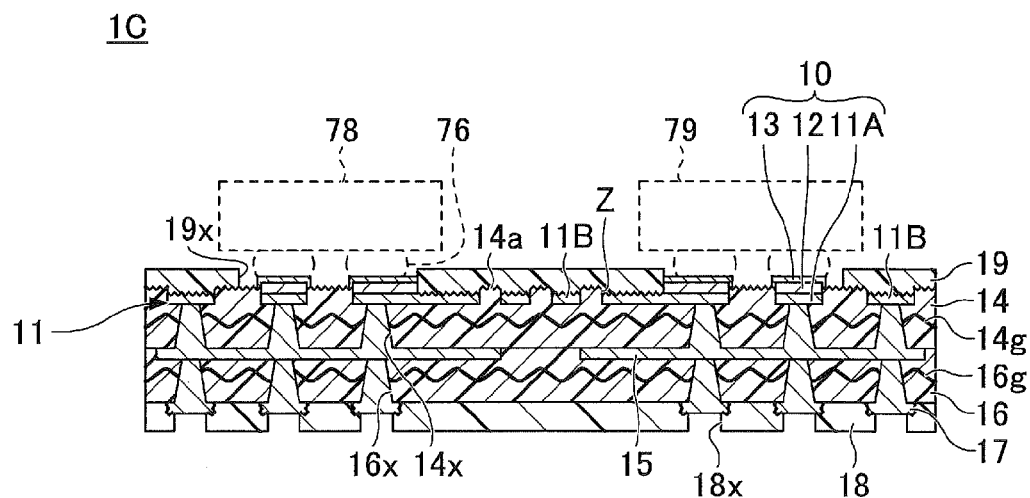

FIGS. 12A and 12B are schematic diagrams illustrating a wiring substrate 1C of the third applied example of the first embodiment. FIG. 12A is a plan view of the wiring substrate 1C. FIG. 12B is a cross-sectional view of the wiring substrate 10. With reference to FIGS. 12A and 12B, the wiring substrate 10 has substantially the same structure as the wiring substrate 1 illustrated in FIG. 1A. The wiring substrate 10 is different from the wiring substrate 1 in that two rows of pads 10 are exposed in each opening 19x of the solder resist layer 19. It is, however, to be noted that three or more rows of pads 10 may be exposed in each opening 19x.

As illustrated with the broken lines in FIGS. 12A and 12B, a semiconductor chip 78 and a semiconductor chip 79 may be flip-chip bonded to the wiring substrate 1C. More specifically, an electrode pad (not illustrated) of the semiconductor chip 78 may be electrically connected to the pad 10 that is exposed in one of the openings 19x of the wiring substrate 1C by way of the bump 76. Further, an electrode pad (not illustrated) of the semiconductor chip 79 may be electrically connected to the pad 10 that is exposed in another one of the openings 19x of the wiring substrate 1C.

In the wiring substrate 10, at least a part of the pads 10 exposed in the one of the openings 19x is electrically connected to at least a part of the pads 10 exposed in another one of the openings 19x by way of the wiring pattern 11B. Thereby, the semiconductor chip 78 and the semiconductor chip 79 that are mounted on the wiring substrate 1C are electrically connected to each other by way of the wiring pattern 11B. Similar to the underfill resin illustrated in FIG. 11, an underfill resin may be supplied between the semiconductor chips 78, 79 and the upper surface of the wiring substrate 10.

Accordingly, by mounting two semiconductor chips 78, 79 on the wiring substrate 10, a semiconductor package having the semiconductor chip 78 and the semiconductor chip 79 connected to each other by way of the wiring pattern 11B is fabricated. In this process of mounting the semiconductor chips 78, 79 on the wiring substrate 10, the wettability of the solder material of the bump 76 is satisfactory because the upper surface 13u of the second metal layer 13 of the pad 10 of the wiring substrate 10 is a smooth surface and the thickness of the second metal layer 13 is even. Thus, the connection reliability between the pad 10 and the electrode pads of the semiconductor chips 78, 79 can be improved.

<Practical example>

In the following practical example, the layer thickness of each of the layers of the wiring substrate according to first-third embodiments are illustrated.

TABLE 1

| NAME | SIGN | THICKNESS (μm) |
|---|---|---|
| SOLDER RESIST LAYER 19 | $SR_{11}$ | 10 |
| STEP PART Z | $Z_{11}$ | 3 |
| WIRING LAYER 11 | $W_{11}$ | 10 |
| INSULATING LAYER 14 | $I_{11}$ | 25 |
| WIRING LAYER 15 | $W_{12}$ | 10 |
| INSULATING LAYER 16 | $I_{12}$ | 25 |
| WIRING LAYER 17 | $W_{13}$ | 10 |
| SOLDER RESIST LAYER 18 | $SR_{12}$ | 10 |
| TOTAL THICKNESS | — | 103 |

Figure 13A:
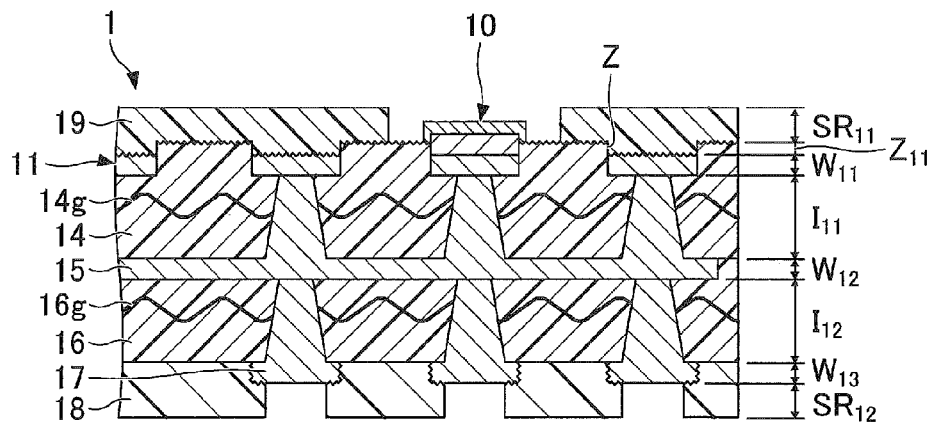
FIGS. 13A-13C are cross-sectional views illustrating a part of a wiring example according to a practical example of the present invention.

FIG. 13A and Table 1 illustrate the layer thickness of each layer of the wiring substrate 1 of the first embodiment. In this example, the layer thickness $I_{11}$ of the insulating layer 14 including the reinforcement member 14g and the layer thickness $I_{12}$ of the insulating layer 16 including the reinforcement member 16g are 25 μm, respectively. Further, the total thickness of the wiring substrate 1 is 103 μm.

TABLE 2

| NAME | SIGN | THICKNESS (μm) |
|---|---|---|
| SOLDER RESIST LAYER 19 | $SR_{21}$ | 7 |
| STEP PART Z | $Z_{21}$ | 3 |
| WIRING LAYER 11 | $W_{21}$ | 8 |
| INSULATING LAYER 14A | $I_{21}$ | 13 |
| WIRING LAYER 15 | $W_{22}$ | 6 |
| INSULATING LAYER 16 | $I_{22}$ | 18 |
| WIRING LAYER 17 | $W_{23}$ | 8 |
| SOLDER RESIST LAYER 18 | $SR_{22}$ | 7 |
| TOTAL THICKNESS | — | 70 |

Figure 13B:
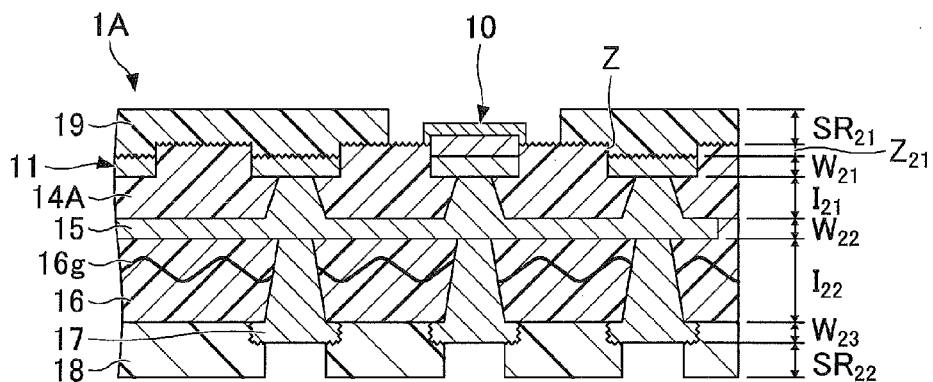

FIG. 13B and Table 2 illustrate the layer thickness of each layer of the wiring substrate 1A of the second embodiment. In this example, because the wiring substrate 1A is formed to be thinner than the wiring substrate 1 of the first embodiment, the insulating layer 16 including the reinforcement member 16g is formed to have a layer thickness $I_{22}$ of 18 μm which is close to the minimum thickness for an insulating layer including a reinforcement member. Further, because an insulating layer having no reinforcement member is used as the insulating layer 14A that is thinner than the insulating layer having a reinforcement member, the insulating layer 14A is formed to have a layer thickness $I_{21}$ of 13 μm which is close to the minimum thickness for an insulating layer including no reinforcement member. Further, the wiring substrate 1A is formed to have a total thickness of 70 μm by adjusting the thickness of each wiring layer and each solder resist layer.

TABLE 3

| NAME | SIGN | THICKNESS (μm) |
|---|---|---|
| SOLDER RESIST LAYER 19 | $SR_{31}$ | 7 |
| STEP PART Z | $Z_{31}$ | 3 |
| WIRING LAYER 11 | $W_{31}$ | 8 |
| INSULATING LAYER 14 | $I_{31}$ | 20 |
| WIRING LAYER 15 | $W_{32}$ | 8 |
| INSULATING LAYER 21 | $I_{32}$ | 17 |
| WIRING LAYER 22 | $W_{33}$ | 8 |
| INSULATING LAYER 16 | $I_{33}$ | 17 |
| WIRING LAYER 17 | $W_{34}$ | 8 |
| SOLDER RESIST LAYER 18 | $SR_{32}$ | 7 |
| TOTAL THICKNESS | — | 103 |

Figure 13C:
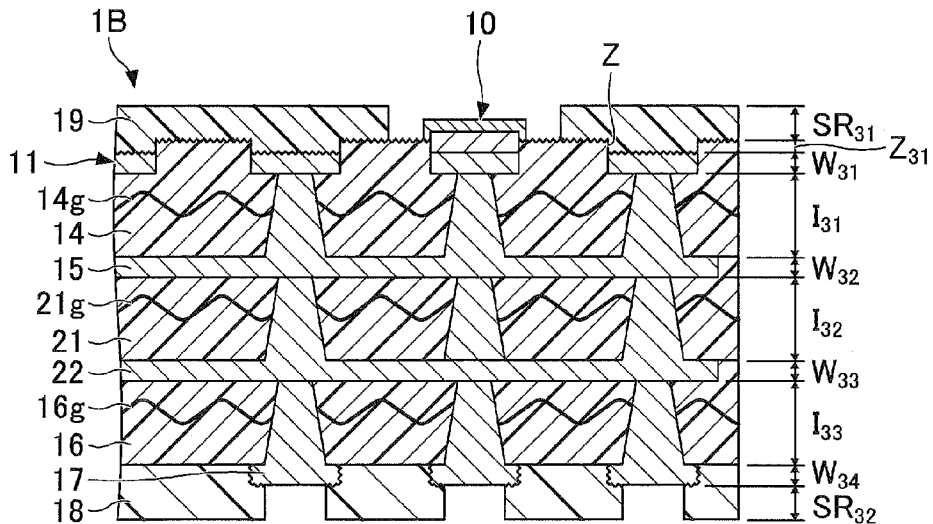

FIG. 13C and Table 3 illustrate the layer thickness of each layer of the wiring substrate 1B of the third embodiment. In this example, because the wiring substrate 1B including four wiring layers is formed to have the same total thickness (103 μm) as the wiring substrate 1 including three wiring layers, the thickness of each insulating layer, each wiring layer, and each solder resist layer is adjusted.

By including/omitting the reinforcement member and adjusting the thickness of each insulating layer, each wiring layer, and each solder resist layer, the wiring substrate 1B having a total thickness that matches a desired specification can be fabricated. In fabricating the wiring substrate 1B, the solder resist layer 19 can be formed thinner than a conventional solder resist layer because a part of the first metal layer 12 is embedded in the insulating layer 14 and the vertical height difference between the upper surface 14a of the insulating layer 14 and the upper surface 13u of the second metal layer 13 is small compared to a conventional wiring substrate. Accordingly, the thickness of the wiring substrate 1B can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, instead of the wiring substrate 1, the wiring substrate 1A or 1B may be used for the semiconductor package 2 or 2A.

What is claimed is:

1. A wiring substrate comprising:
an insulating layer including upper and lower surfaces;
a wiring layer including upper, lower, and side surfaces and being in a position that is recessed relative to the upper surface of the insulating layer;
a via wiring formed in the insulating layer and connected to the lower surface of the wiring layer; and
a solder resist layer formed on the upper surface of the insulating layer;
wherein the via wiring includes a first part contacting the lower surface of the wiring layer and a second part exposed from the lower surface of the insulating layer, the first part having an area smaller than an area of the second part,
wherein the wiring layer includes a pad body that constitutes a part of a pad and a wiring pattern including an upper surface,
wherein the solder resist layer includes an upper surface and an opening that exposes the pad and a part of the upper surface of the insulating layer,
wherein the solder resist layer buries a step part formed by the upper surface of the insulating layer and the upper surface of the wiring pattern,
wherein the pad includes
the pad body including upper and lower surfaces, the lower surface of the pad body contacting the first part of the via wiring,
a first metal layer formed on the upper surface of the pad body, the first metal layer including an embedded part embedded in the insulating layer and a projecting part projecting from the upper surface of the insulating layer, the projecting part including upper and side surfaces of the first metal layer which is exposed from the upper surface of the insulating layer, and
a second metal layer including an upper surface and covering the upper and side surfaces of the projecting part of the first metal layer,
wherein the upper surface of the pad body and the upper surface of the wiring pattern are on the same plane, and
wherein the upper surface of the second metal layer is positioned lower than the upper surface of the solder resist layer.

2. The wiring substrate as claimed in claim 1, wherein the upper surface of the pad body is a smooth surface, and
wherein the upper surface of the wiring pattern is a roughened surface.

3. The wiring substrate as claimed in claim 1, wherein the upper surface of the insulating layer is a roughened surface.

4. The wiring substrate as claimed in claim 1, further comprising:
a second wiring layer formed on a side of the lower surface of the insulating layer; and
a second solder resist layer formed on the side of the lower surface of the insulating layer and including a second opening that selectively exposes the second wiring layer;
wherein the second wiring layer includes a lower outer edge part that is covered by the second solder resist layer,
wherein the second wiring layer includes a lower center part that is exposed in the second opening,
wherein the lower outer edge part of the second wiring layer has a roughness that is the same as a roughness of the upper surface of the wiring pattern, and
wherein the lower center part of the second wiring layer has a roughness that is the same as a roughness of the upper surface of the pad body.

5. The wiring substrate as claimed in claim 1, wherein the pad is configured to be connected to a bonding wire.

6. The wiring substrate as claimed in claim 1, wherein the pad body is formed of copper, the first metal layer is formed of nickel, and the second metal layer is formed of gold.

7. The wiring substrate as claimed in claim 1, wherein the insulating layer includes a reinforcement member.

* * * * *